(12) United States Patent
Kim

(10) Patent No.: US 11,923,264 B2
(45) Date of Patent: Mar. 5, 2024

(54) SEMICONDUCTOR APPARATUS FOR DISCHARGING HEAT

(71) Applicant: Samsung Electronics Co., Ltd., Suwon-si (KR)

(72) Inventor: Yongha Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 613 days.

(21) Appl. No.: 17/002,096

(22) Filed: Aug. 25, 2020

(65) Prior Publication Data

US 2021/0090968 A1 Mar. 25, 2021

(30) Foreign Application Priority Data

Sep. 20, 2019 (KR) .................. 10-2019-0116366
Mar. 4, 2020 (KR) .................. 10-2020-0027214

(51) Int. Cl.
*H01L 23/34* (2006.01)
*C09J 9/02* (2006.01)
(Continued)

(52) U.S. Cl.
CPC .............. *H01L 23/34* (2013.01); *C09J 9/02* (2013.01); *H01L 23/3733* (2013.01);
(Continued)

(58) Field of Classification Search
CPC ... H01L 23/34; H01L 23/367; H01L 23/3733; H01L 23/3735; H01L 23/4828;
(Continued)

(56) References Cited

U.S. PATENT DOCUMENTS 7,297,401 B2  11/2007  Nakahara
9,123,686 B2  9/2015  Mataya et al.
(Continued)

FOREIGN PATENT DOCUMENTS

JP  2010251386 A  11/2010
JP  2015088575 A  5/2015
(Continued)

*Primary Examiner* — Yara B Green
*Assistant Examiner* — Christopher M Roland
(74) *Attorney, Agent, or Firm* — Fish & Richardson P.C.

(57) ABSTRACT

A semiconductor apparatus includes: a system substrate; a semiconductor package mounted on the system substrate and having a first length in a first horizontal direction; a conductive label flexible and arranged on the semiconductor package, the conductive label including: a first adhesive layer contacting the semiconductor package; a thermally-conductive layer attached to the semiconductor package by the first adhesive layer and having a second length in the first horizontal direction greater than the first length; and a second adhesive layer contacting a portion of a surface of the conductive layer, the portion not vertically overlapping the semiconductor package; a thermal interface material (TIM) arranged on the conductive layer to vertically overlap the semiconductor package; and a cover including: a first cover portion vertically overlapping the semiconductor package and contacting the TIM; and a second cover portion to which the thermally-conductive layer is attached by the second adhesive layer.

14 Claims, 16 Drawing Sheets

(51) Int. Cl.
    *H01L 23/373*     (2006.01)
    *H01L 23/482*     (2006.01)
    *H01L 23/538*     (2006.01)

(52) U.S. Cl.
    CPC ...... *H01L 23/3735* (2013.01); *H01L 23/4828* (2013.01); *C09J 2203/326* (2013.01); *C09J 2301/124* (2020.08); *C09J 2301/314* (2020.08); *H01L 23/5387* (2013.01)

(58) Field of Classification Search
    CPC ... H01L 23/5387; C09J 9/02; C09J 2203/326; C09J 2301/124; C09J 2301/314
    See application file for complete search history.

(56)     References Cited

U.S. PATENT DOCUMENTS

| | | | |
|---|---|---|---|
| 9,673,494 | B2 | 6/2017 | Rich et al. |
| 9,743,553 | B2 | 8/2017 | Kim et al. |
| 9,820,373 | B2 | 11/2017 | Pennathur et al. |
| 9,965,003 | B2 | 5/2018 | Cheng et al. |
| 2002/0105071 | A1* | 8/2002 | Mahajan ................. H01L 23/36 257/E23.101 |
| 2010/0059203 | A1 | 3/2010 | Chu et al. |
| 2013/0081796 | A1* | 4/2013 | Horiuchi ............. H01L 21/4882 156/247 |
| 2015/0035134 | A1* | 2/2015 | Hung ..................... H01L 24/92 257/712 |
| 2015/0305192 | A1 | 10/2015 | Chi et al. |
| 2015/0331460 | A1 | 11/2015 | Mataya et al. |
| 2016/0282914 | A1 | 9/2016 | Saito et al. |
| 2017/0023306 | A1 | 1/2017 | Stavi et al. |
| 2018/0233428 | A1 | 8/2018 | Kim |
| 2018/0288908 | A1 | 10/2018 | Lee et al. |
| 2019/0118511 | A1 | 4/2019 | Wakabayashi et al. |
| 2019/0363051 | A1* | 11/2019 | Jung ................... H01L 23/3675 |

FOREIGN PATENT DOCUMENTS

| | | |
|---|---|---|
| JP | 2017-096608 A | 6/2017 |
| JP | 6557112 B2 | 8/2019 |
| KR | 1020160070243 A | 6/2016 |
| KR | 10-2018-0109615 A | 10/2018 |
| KR | 10-1992749 B1 | 6/2019 |

\* cited by examiner

SEMICONDUCTOR APPARATUS FOR DISCHARGING HEAT

CROSS-REFERENCE TO RELATED APPLICATIONS

This application claims the benefit of Korean Patent Application No. 10-2019-0116366, filed on Sep. 20, 2019, and Korean Patent Application No. 10-2020-0027214, filed on Mar. 4, 2020, in the Korean Intellectual Property Office, the disclosures of which are incorporated herein in their entirety by reference.

BACKGROUND

The inventive concept relates to a semiconductor apparatus, and more particularly, to a semiconductor apparatus including a semiconductor package.

Semiconductor packages may generate much heat due to the implementation of high performance and various functions thereof. Accordingly, the heat dissipation performance of semiconductor apparatuses including semiconductor packages is essential for securing the operation stability and product reliability of semiconductor chips in the semiconductor packages. Therefore, structures of semiconductor apparatuses capable of effectively discharging heat out of the semiconductor apparatuses have been actively studied, the heat being generated from the semiconductor packages in limited spaces provided by covers of the semiconductor apparatuses.

SUMMARY

The inventive concept provides a semiconductor apparatus capable of quickly discharging heat generated from a semiconductor package to the outside of the semiconductor apparatus.

The inventive concept also provides a semiconductor apparatus capable of suppressing short-circuit defects.

According to an aspect of the inventive concept, a semiconductor apparatus includes a system substrate; a semiconductor package mounted on the system substrate and having a first length in a first horizontal direction; a conductive label that is flexible and arranged on the semiconductor package, the conductive label including: a first adhesive layer contacting the semiconductor package; a thermally-conductive layer, which is attached to the semiconductor package by the first adhesive layer and has a second length in the first horizontal direction greater than the first length of the semiconductor package; and a second adhesive layer contacting a portion of a surface of the conductive layer, the portion not vertically overlapping the semiconductor package; a thermal interface material (TIM) arranged on the conductive layer to vertically overlap the semiconductor package; and a cover including: a first cover portion vertically overlapping the semiconductor package and contacting the TIM; and a second cover portion to which the thermally-conductive layer is attached by the second adhesive layer.

According to another aspect of the inventive concept, a semiconductor apparatus includes a system substrate; a semiconductor package mounted on the system substrate and having a first length in a first horizontal direction; a cover disposed such that a top surface of the semiconductor package is not covered by the cover, and the cover surrounds a side surface of the semiconductor package; and a conductive label connecting the semiconductor package to the cover, the conductive label including: a first adhesive layer contacting the semiconductor package; and a thermally-conductive layer arranged on the first adhesive layer and having a second length in the first horizontal direction greater than the first length of the semiconductor package.

According to yet another aspect of the inventive concept, a semiconductor apparatus includes a first system substrate; a second system substrate vertically apart from the first system substrate; a flexible substrate connecting the first system substrate to the first system substrate; a cover surrounding the first system substrate, the second system substrate, and the flexible substrate; a first semiconductor package mounted on the first system substrate and having a first length in a first horizontal direction; a second semiconductor package mounted on the second system substrate and having a second length in the first horizontal direction; a first conductive label between the first semiconductor package and the cover, the first conductive label including: a first adhesive layer contacting the first semiconductor package; a first thermally-conductive layer arranged on the first adhesive layer and having a third length in the first horizontal direction greater than the first length of the first semiconductor package in the first horizontal direction; and a second adhesive layer arranged on the first thermally-conductive layer to contact the cover and attaching the first conductive layer to an inner surface of the cover; and a second conductive label between the second semiconductor package and the cover, the second conductive label including: a third adhesive layer contacting the second semiconductor package; a second thermally-conductive layer arranged on the third adhesive layer and having a fourth length in the first horizontal direction greater than the second length of the second semiconductor package in the first horizontal direction; and a fourth adhesive layer arranged on the second conductive layer to contact the cover and attaching the second thermally-conductive layer to the inner surface of the cover.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

Figure 1:
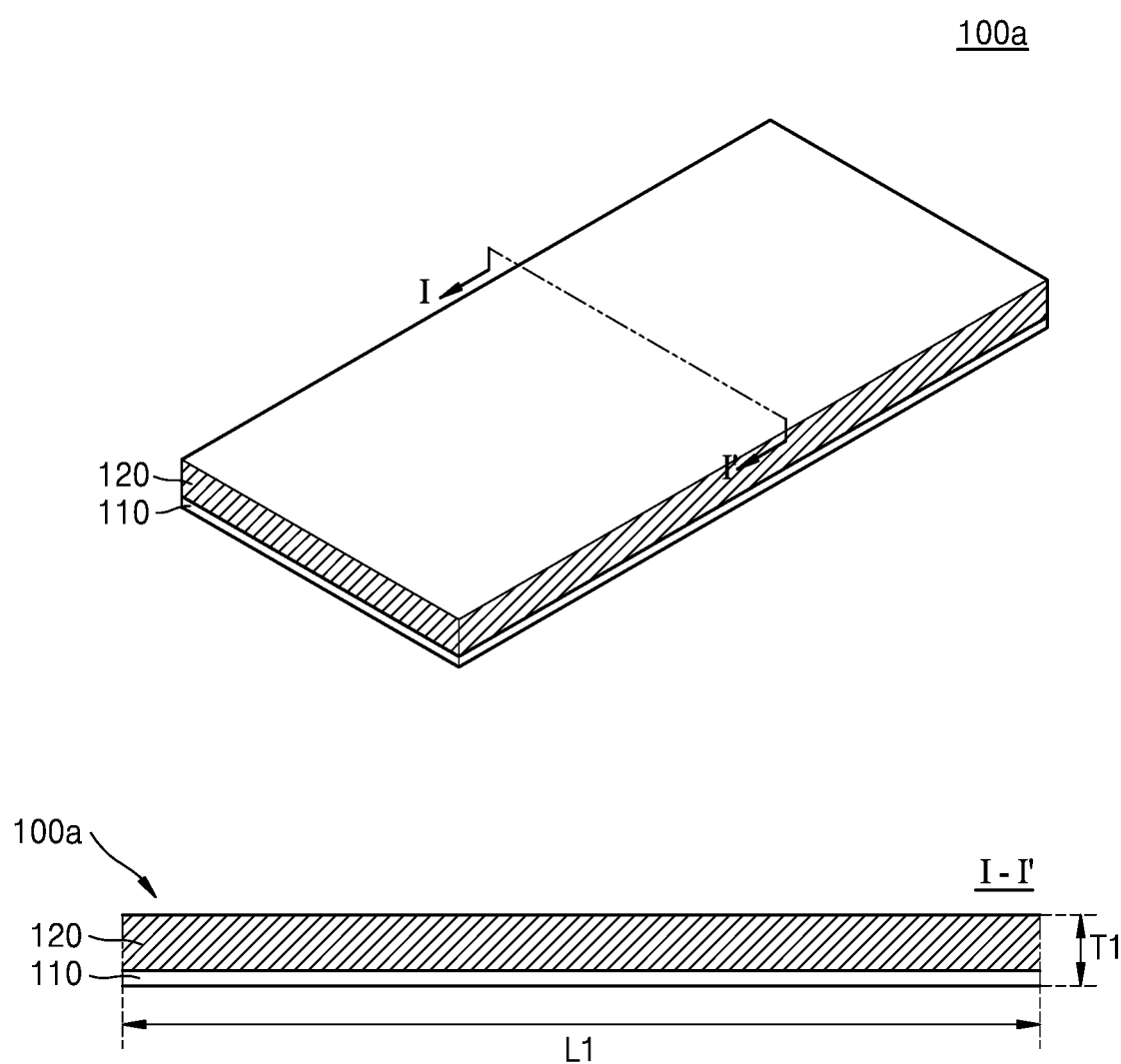
FIG. 1 is a cross-sectional view of a first conductive label according to an example embodiment of the inventive concept.

FIG. 1 is a cross-sectional view of a first conductive label 100a according to an example embodiment of the inventive concept.

Referring to FIG. 1, the first conductive label 100a according to an example embodiment of the inventive concept includes a first adhesive layer 110 and a conductive layer 120. The conductive label may also be described as a conductive tape, or a conductive sheet. Though described as a conductive label 100a, the conductive label 100a need not include any printing or other indicia on it.

Figure 3:
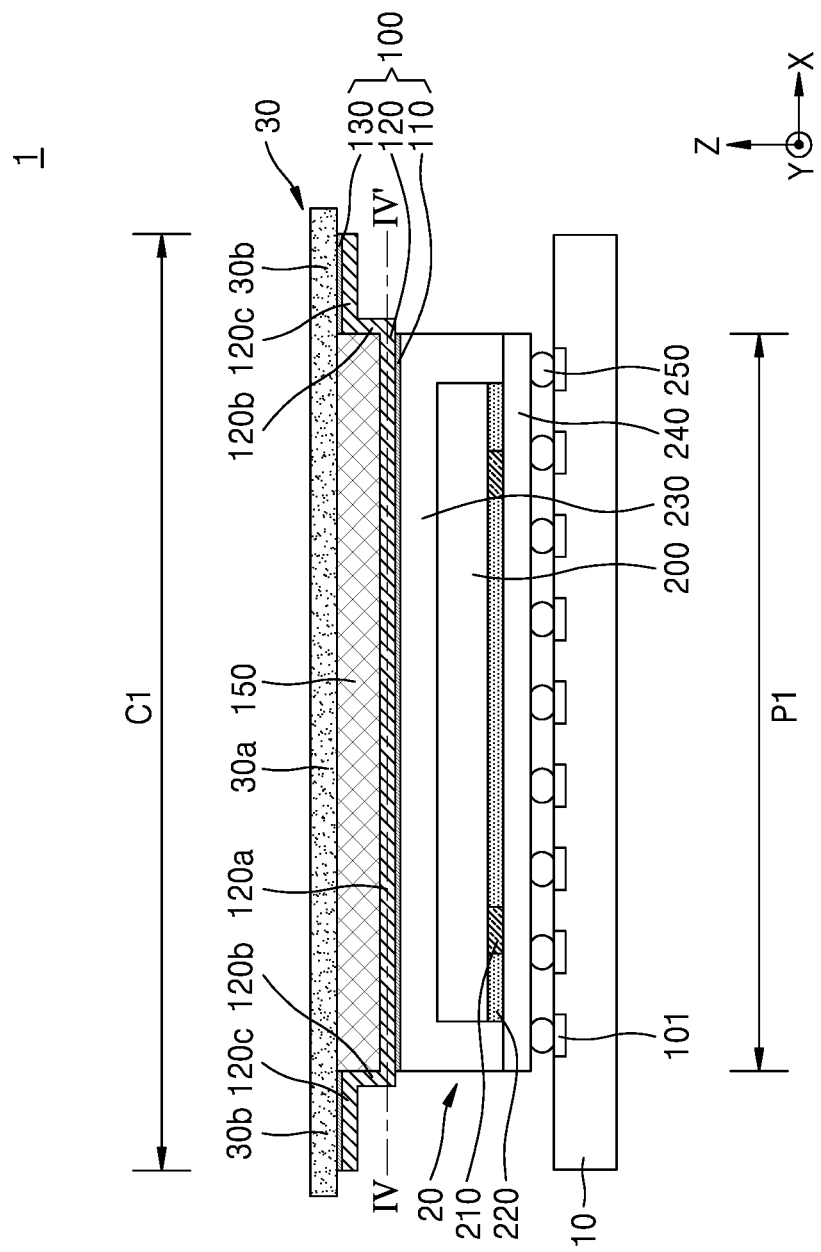
FIG. 3 is a cross-sectional view of a semiconductor apparatus according to an example embodiment of the inventive concept.

In an example embodiment, the first conductive label 100a may be a flexible, bendable label transferring heat generated from a semiconductor package (for example, 20 of FIG. 3) to a cover (for example, 30 of FIG. 3). In addition, the first conductive label 100a may be a label having adhesive properties. For example, the first conductive label 100a may have a plate shape attached to a top surface of the semiconductor package 20 and an inner surface of the cover 30 and transferring heat generated from the semiconductor package 20 to the cover 30.

In an example embodiment, a vertical length (that is, a thickness T1) of the first conductive label 100a may be significantly less than a horizontal length L1 of the first conductive label 100a. For example, the vertical length T1 of the first conductive label 100a may be about 10 times to about 100000 times less than the horizontal length L1 thereof. As described above, because the vertical length T1 of the first conductive label 100a may be significantly less than the horizontal length L1 thereof, the first conductive label 100a may be flexible, bendable, and conformable. For example, based on its thin profile, the first conductive label 100a have the property of, without perforations or pre-set edges, bending under its own weight.

In an example embodiment, the vertical length T1 of the first conductive label 100a may be in a range from about 0.10 millimeters (mm) to about 0.50 mm. More specifically, the vertical length T1 of the first conductive label 100a may be in a range from about 0.20 mm to about 0.35 mm. In these cases, the horizontal length of the first conductive label 100a, according to certain examples, in one direction such as the X direction (see FIG. 3), may be longer than the length P1 of the semiconductor package, and may be, for example, in a range from about 1 cm to a length 2.5 times to 10 times the length of the semiconductor package in the X direction, or to a length as long as the length in the X direction of the semiconductor apparatus that houses the semiconductor package. These horizontal lengths may apply to any of the different vertical lengths T1 described above (e.g., to any vertical length T1 between about 0.10 mm to about 0.50 mm), and may apply in the various embodiments described herein. Additional examples will be described below. However, the inventive concept is not limited to these examples, and the vertical length T1 and horizontal length L1 of the first conductive label 100a may have various values according to the size of a semiconductor apparatus (for example, 1 of FIG. 3) including the semiconductor package 20. Furthermore, terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first adhesive layer 110 of the first conductive label 100a may attach the conductive layer 120 onto the semiconductor package 20. For example, the first adhesive layer 110 may have a direct connection with both the conductive layer 120 and the semiconductor package 20. The first adhesive layer 110 may be a non-conductive film (NCF). For example, the first adhesive layer 110 may be a film including an insulating polymer. The first adhesive layer 110 may be non-electrically conductive, but may be thermally conductive. The term non-conductive film, or NCF, is used herein to refer to a component that is not electrically conductive. In addition, the first adhesive layer 110 may be a film having adhesive properties in itself. For example, the first adhesive layer 110 may be a double-sided adhesive film.

The conductive layer 120 of the first conductive label 100a may be arranged on the first adhesive layer 110 and may transfer the heat generated from the semiconductor package 20 to the cover 30. The thickness of the conductive layer 120 may be greater than the thickness of the first adhesive layer 110.

The conductive layer 120 may include a material having excellent thermal conductivity. In an example embodiment, the conductive layer 120 may include a metal material having excellent thermal conductivity. For example, the conductive layer 120 may include a metal material such as copper (Cu), gold (Au), silver (Ag), aluminum (Al), magnesium (Mg), or nickel (Ni).

In an example embodiment, the conductive layer 120 may include a carbon-based material having excellent thermal conductivity. For example, the conductive layer 120 may include graphite, diamond, carbon fibers, or the like. In addition, the conductive layer 120 may include a polymeric material having excellent thermal conductivity. However, the conductive layer 120 is not limited to the materials set forth above and may include combinations of the materials set forth above or include other materials not mentioned above.

The conductive layer 120 may be formed of a thermally-conductive, or heat-conductive material, such as one of the above-listed materials. It may or may not be electrically conductive, based on the material used. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials. Also, components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other.

Figure 2:
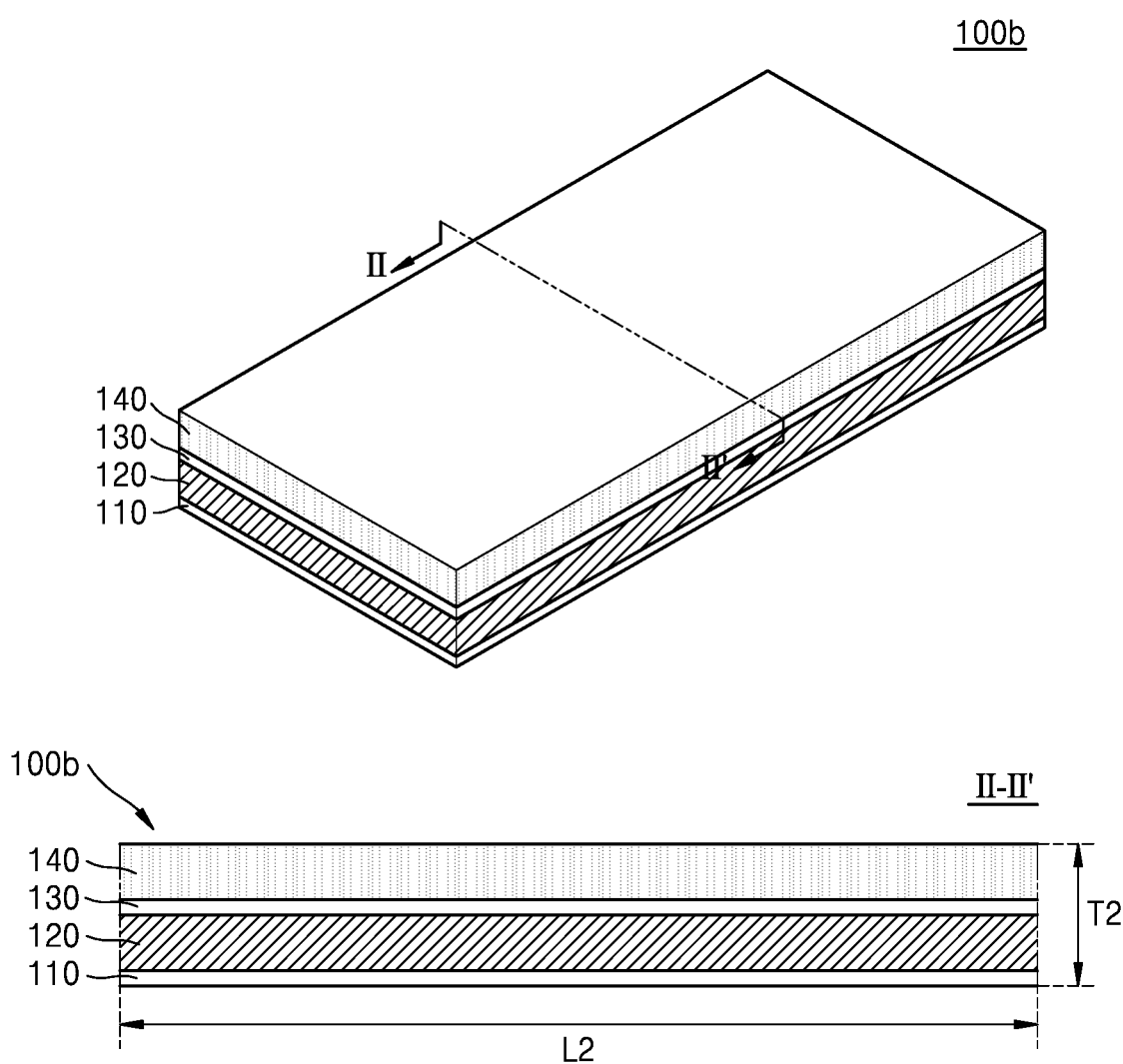
FIG. 2 is a cross-sectional view of a second conductive label according to an example embodiment of the inventive concept.

FIG. 2 is a cross-sectional view of a second conductive label 100b according to an example embodiment of the inventive concept.

Referring to FIG. 2, the second conductive label 100b according to an example embodiment of the inventive concept may include the first adhesive layer 110, the conductive layer 120, a second adhesive layer 130, and an insulating layer 140. For example, the second conductive label 100b may have a structure in which the first adhesive layer 110, the conductive layer 120, the second adhesive layer 130, and the insulating layer 140 are sequentially stacked in this stated order. Descriptions of the first adhesive layer 110 and the conductive layer 120 of the second conductive label 100b are substantially the same as those given regarding the first conductive label 100a and thus will be omitted.

The second conductive label 100b may be a flexible label transferring the heat generated from the semiconductor package 20 to the cover 30. In addition, the second conductive label 100b may be a label having adhesive properties.

In an example embodiment, a vertical length (that is, a thickness T2) of the second conductive label 100b may be significantly less than a horizontal length L2 of the second conductive label 100b. For example, the vertical length T2 of the second conductive label 100b may be about 10 times to about 100000 times less than the horizontal length L2 thereof. Because the vertical length T2 of the second conductive label 100b may be significantly less than the horizontal length L2 thereof, the second conductive label 100b may be flexible, bendable, and conformable.

In an example embodiment, the vertical length T2 of the second conductive label 100b may range from about 0.10 mm to about 3.00 mm. More specifically, the vertical length T2 of the second conductive label 100b may range from about 0.20 mm to about 0.50 mm. In these cases, the horizontal length in one direction, according to certain examples, may be longer than the length of the semiconductor package to which the second conductive label 100b is attached, and may be, for example, in a range from about 1 cm to a length 2.5 times to 10 times the length of the semiconductor package in the X direction, or to a length as long as to a length of the semiconductor apparatus that houses the semiconductor package. Additional examples will be described below. However, the inventive concept is not limited thereto, and the vertical length T2 of the second conductive label 100b may have various values according to the size of a semiconductor apparatus (for example, 1 of FIG. 3) including a semiconductor package (for example, 20 of FIG. 3).

In an example embodiment, the second adhesive layer 130 of the second conductive label 100b may attach the insulating layer 140 onto the conductive layer 120. The second adhesive layer 130 may be a non-conductive film. For example, the second adhesive layer 130 may be a film including an electrically insulating polymer. In addition, the second adhesive layer 130 may be a film having adhesive properties in itself. For example, the second adhesive layer 130 may be a double-sided adhesive film. In addition, the second adhesive layer 130 may include substantially the same material as that of the first adhesive layer 110.

In an example embodiment, the insulating layer 140 of the second conductive label 100b, which may be an electrically insulating layer, may prevent contact between the conductive layer 120 and a system substrate (for example, 10 of FIG. 3) for example, outside of an area where the semiconductor package is located. The insulating layer 140 of the second conductive label 100b may electrically insulate the conductive layer 120 from the system substrate 10. For example, the insulating layer 140 may be a layer for suppressing short circuits from occurring by preventing contact between the conductive layer 120 and the system substrate 10, for example, due to warping, or physical force exerted outside of the area occupied by the semiconductor package. It should be noted, that the term "contact" refers to a direct connection (e.g., touching), unless the context clearly indicates otherwise.

For example, the insulating layer 140 may include at least one of an epoxy resin, polybenzobisoxazole (PBO), benzocyclobutene (BCB), polyimide, and a polyimide derivative. However, the inventive concept is not limited thereto, and the insulating layer 140 may include various insulating materials.

Unlike FIG. 2, while the second conductive label 100b includes the first adhesive layer 110, the conductive layer 120, and the second adhesive layer 130, the second conductive label 100b may not include the insulating layer 140. For example, to arrange the conductive layer 120 between a first component and a second component, the second conductive label 100b may include the first adhesive layer 110 and the second adhesive layer 130 respectively attached to both surfaces of the conductive layer 120 and may not include the insulating layer 140.

Hereinafter, more detailed descriptions will be made regarding semiconductor apparatuses capable of quickly discharging heat generated from semiconductor packages to the outside of the semiconductor apparatuses by using a conductive label having a structure that is substantially the same as or similar to those of the first and second conductive labels 100a and 100b described above.

FIG. 3 is a cross-sectional view of a semiconductor apparatus 1 according to an example embodiment of the inventive concept. The semiconductor apparatus 1 according to an example embodiment of the inventive concept may include the system substrate 10, the semiconductor package 20, the cover 30, a conductive label 100, and a thermal interface material 150.

The system substrate 10 may be a substrate for connecting the semiconductor package 20 to an external apparatus, such as one or more components of the semiconductor apparatus 1. The system substrate 10 may include a substrate pad 101 (e.g., a plurality of substrate pads 101) contacting a package connection terminal 250 (e.g., a plurality of respective package connection terminals 250) of the semiconductor package 20. In an example embodiment, the system substrate 10 may be a single-sided printed circuit board (PCB) including the substrate pads 101 on only one surface thereof. However, the inventive concept is not limited thereto, and the system substrate 10 may be a double-sided PCB including the substrate pads 101 on both surfaces thereof. The system substrate 10 is not limited to structures and materials of PCBs and may include, for example, various substrates such as ceramic substrates.

The semiconductor package 20 may be mounted on the system substrate 10 and may include a semiconductor chip 200 connected to the substrate pads 101 of the system substrate 10. In an example embodiment, the semiconductor package 20 may include the semiconductor chip 200, a molding layer 230, a wiring structure 240, and the package connection terminals 250. The semiconductor package 20 may have a first length P1 in a horizontal direction (for example, an X direction). The horizontal direction may be defined as a direction that is substantially parallel to an extension direction of a top surface of the semiconductor chip 200. Though not shown in FIG. 3, the semiconductor package 20 may have a second length in a second horizontal direction (for example, a Y direction).

Although FIG. 3 illustrates that the semiconductor package 20 includes one semiconductor chip 200, the semiconductor package 20 may include two or more semiconductor chips 200. The semiconductor chips 200 included in the semiconductor package 20 may be of the same type or be of different types. In an example embodiment, the semiconductor package 20 may be a system-in-package (SIP) in which different types of semiconductor chips 200 are electrically connected to each other to be operated as one system.

The semiconductor chip 200 may include a semiconductor device layer (not shown), also described as an active layer, and the semiconductor device layer may be formed in a lower portion of the semiconductor chip 200. A plurality of individual devices of various types may be formed in the semiconductor device layer. In an example embodiment, the plurality of individual devices may include various microelectronic devices, for example, complementary metal-insulator-semiconductor (CMOS) transistors, metal-oxide-semiconductor filed effect transistors (MOSFETs), system large scale integrations (system LSIs), imaging sensors such as CMOS imaging sensors (CIS s), micro-electro-mechanical systems (MEMSs), active elements, passive elements, and the like.

The semiconductor chip 200 may include a memory semiconductor chip. For example, the memory semiconductor chip may include a volatile memory semiconductor chip such as dynamic random access memory (DRAM) or static random access memory (SRAM), and may include a nonvolatile memory semiconductor chip such as phase-change random access memory (PRAM), magneto-resistive random access memory (MRAM), ferroelectric random access memory (FeRAM), or resistive random access memory (RRAM).

In addition, the semiconductor chip 200 may include a logic semiconductor chip. The logic semiconductor chip may include, for example, a logic semiconductor chip such as a central processor unit (CPU), a micro-processor unit (MPU), a graphics processor unit (GPU), or an application processor (AP). As used herein, the term "semiconductor device" may be used to refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages.

In an example embodiment, the semiconductor chip 200 may include silicon (Si). However, the inventive concept is not limited thereto, and the semiconductor chip 200 may include a semiconductor element such as germanium (Ge) or a compound semiconductor such as silicon carbide (SiC), gallium arsenide (GaAs), indium arsenide (InAs), and indium phosphide (InP).

In an example embodiment, the semiconductor chip 200 may include a chip pad 210 (e.g., a plurality of chip pads 210). The chip pads 210 may be electrically connected to the plurality of individual devices of various types, which have been described above.

In an example embodiment, the semiconductor chip 200 may include a passivation layer 220, which surrounds a side surface of the chip pad 210 and exposes one surface of the chip pad 210. The passivation layer 220 may include an insulating material. In addition, the passivation layer 220 may have a thickness of about 2 micrometers (μm) to about 100 μm. More specifically, the passivation layer 220 may have a thickness of about 3 μm to about 50 μm. However, the inventive concept is not limited thereto, and the passivation layer 220 may have various thicknesses.

The molding layer 230 may surround, on the wiring structure 240, at least a portion of a side surface of the semiconductor chip 200. In an example embodiment, the molding layer 230 may surround both the top and side surfaces of the semiconductor chip 200. However, the inventive concept is not limited thereto and, as described below, the molding layer 230 may expose the top surface of the semiconductor chip 200 while surrounding the side surface of the semiconductor chip 200.

In an example embodiment, the molding layer 230 may include an epoxy molding compound (EMC). However, the inventive concept is not limited thereto, and the molding layer 230 may include various electrically insulating materials such as an epoxy-based material, a thermosetting material, a thermoplastic material, and an ultraviolet (UV)-treated material.

In an example embodiment, the wiring structure 240 may be a structure for electrically connecting the semiconductor chip 200 to the package connection terminals 250. For example, the wiring structure 240 may be a redistribution structure including a redistribution pattern and an insulating material surrounding the redistribution pattern. However, the inventive concept is not limited thereto, and the wiring structure 240 may be a PCB configured to electrically connect the semiconductor chip 200 to the package connection terminals 250.

The semiconductor package 20 is not limited to the structure set forth above and may include variously-structured semiconductor packages. For example, as shown in FIG. 3, the semiconductor package 20 may be, but is not limited to, a fan-out wafer level package (FOWLP), and may be a fan-in wafer level package (FIWLP). In addition, the semiconductor package 20 may be a panel level package (PLP).

The conductive label 100 may be attached to both the top surface of the semiconductor package 20 and the inner surface of the cover 30. More specifically, despite a height difference between the top surface of the semiconductor package 20 and the inner surface of the cover 30, due to the flexibility and bendability of the conductive label 100, the conductive label 100 may be attached to both the top surface of the semiconductor package 20 and the inner surface of the cover 30, even though they are at different heights above a surface of the system substrate 10.

The conductive label 100 may include a first adhesive layer 110, a conductive layer 120, and a second adhesive layer 130. The first adhesive layer 110 may contact the top surface of the semiconductor package 20. More specifically, the first adhesive layer 110 may be arranged between the semiconductor package 20 and the conductive layer 120. The first adhesive layer 110 may attach a portion of the conductive layer 120 to the top surface of the semiconductor package 20.

The conductive layer 120 may transfer the heat generated from the semiconductor package 20 to the cover 30. In an example embodiment, the conductive layer 120 may be in the form of a sheet, and may have a plate shape, in which a vertical (Z-direction) length thereof is significantly less than a horizontal (X-direction) length thereof. For example, a thickness of the conductive layer 120 in a direction away from (e.g., perpendicular to) a surface on which it is disposed, may be significantly less than a length of the conductive layer 120 along the surface on which it is disposed (e.g., from 1/10 to 1/100,000 of the length). Due to the above-described structure of the conductive layer 120, the conductive layer 120 may be flexible. In addition, a horizontal (X-direction) length C1 of the conductive layer 120 may be greater than a horizontal (X-direction) length P1 of the semiconductor package 20. Accordingly, the conductive layer 120 may be partially arranged over the semiconductor package 20 and may be partially arranged under the cover 30 where the semiconductor package 20 is not disposed.

The second adhesive layer 130 may contact the inner surface of the cover 30. More specifically, the second adhesive layer 130 may be arranged between the cover 30 and the conductive layer 120. The second adhesive layer 130 may attach a portion of the conductive layer 120 to the inner surface of the cover 30.

In an example embodiment, the conductive layer 120 may include a first conductive portion 120a, a second conductive portion 120b, and a third conductive portion 120c. For example, these may be thermally-conductive portions. The first conductive portion 120a may be a portion of the conductive layer 120, which vertically overlaps the semiconductor package 20 (e.g., from a plan view) and is arranged between the first adhesive layer 110 and the thermal interface material 150. The first conductive portion 120a may transfer the heat generated from the semiconductor package 20 to a lower portion of the thermal interface material 150.

The second conductive portion 120b may be a portion of the conductive layer 120, which is bent upward from the first conductive portion 120a and surrounds a side surface of the thermal interface material 150. In one embodiment, the second conductive portion 120b may extend vertically, and may have a vertically-extending surface that contacts the side surface of the thermal interface material 150. The second conductive portion 120b may transfer the heat generated from the semiconductor package 20 to a side portion of the thermal interface material 150.

The third conductive portion 120c may be a portion of the conductive layer 120, which is laterally bent from the second conductive portion 120b and is attached to the inner surface of the cover 30 by the second adhesive layer 130. In addition, the third conductive portion 120c does not vertically overlap the semiconductor package 20 (from a plan view). The third conductive portion 120c may be outside of an area occupied by the semiconductor package 20, from a plan view. The third conductive portion 120c may transfer the heat generated from the semiconductor package 20 to a portion of the cover 30, which does not vertically overlap the semiconductor package 20 from a plan view.

The thermal interface material 150 may be arranged between the semiconductor package 20 and the cover 30 and transfer the heat generated from the semiconductor package 20 to the cover 30.

In an example embodiment, the thermal interface material 150 may be arranged on the conductive layer 120 to vertically overlap the semiconductor package 20, from a plan view. More specifically, the thermal interface material 150 may be arranged between the cover 30 and the first conductive portion 120a. In addition, bottom and side surfaces of the thermal interface material 150 may be respectively surrounded by the first conductive portion 120a and the second conductive portion 120b, and a top surface of the thermal interface material 150 may be surrounded by the cover 30.

The thermal interface material 150 may include a thermally conductive material. In an example embodiment, the thermal interface material 150 may include mineral oil, grease, gap filler putty, phase change gel, a phase change material pad, particle filled epoxy, or the like. However, the inventive concept is not limited thereto, and the thermal interface material 150 may include various materials having excellent thermal conductivity.

The cover 30 may cover the semiconductor package 20 to protect the semiconductor package 20 from an external impact. As shown in FIG. 3, the cover 30 may surround the top surface of the semiconductor package 20. However, the inventive concept is not limited thereto, and the cover 30 may cover all of the side and top surfaces of the semiconductor package 20 and a bottom surface of the system substrate 10.

In an example embodiment, the cover 30 may be a case forming an exterior of the semiconductor apparatus 1 or be a case for packing the semiconductor package 20. For example, the case may surround at least top and bottom surfaces of the semiconductor package 20, as may additionally surround 2-4 additional side surfaces. However, the inventive concept is not limited thereto, and the cover 30 may be a heat dissipation member for heat dissipation of the semiconductor package 20.

In an example embodiment, the cover 30 may include a material having excellent thermal conductivity to quickly discharge the heat generated from the semiconductor package 20 to the outside of the semiconductor apparatus 1. For example, the cover 30 may include a metal material such as copper (Cu), gold (Au), silver (Ag), aluminum (Al), magnesium (Mg), or nickel (Ni). However, the inventive concept is not limited thereto, and the cover 30 may include a carbon-based material having excellent thermal conductivity, such as graphite, diamond, or carbon fibers.

The cover 30 may include a first cover portion 30a and a second cover portion 30b. The first cover portion 30a may be a portion of the cover 30, which vertically overlaps the semiconductor package 20 from a plan view and contacts the thermal interface material 150. In addition, the second cover portion 30b may be a portion of the cover 30, which does not vertically overlap the semiconductor package 20 from a plan view and contacts the second adhesive layer 130.

The semiconductor apparatus 1 according to an example embodiment of the inventive concept may be an electronic device such as a solid state drive apparatus. In addition, the cover 30 may be a case forming an exterior of the solid state drive apparatus. For example, the cover 30 may surround exteriors of the system substrate 10 and the semiconductor package 20. However, the semiconductor apparatus 1 is not limited thereto, and in some embodiments, can also be an electronic device such as a mobile phone, tablet device, laptop computer, music player device, or other personal electronic device, or an external hard drive or other computer component.

The thermal interface material 150 included in a general semiconductor apparatus may be within the area defined by the top surface of the semiconductor package 20. For example, when the thermal interface material 150 is viewed from a planar viewpoint (that is, when the thermal interface material 150 is viewed from above an X-Y plane), the area of the top surface of the thermal interface material 150 may be equal to or less than the area of the top surface of the semiconductor package 20, and the thermal interface material 150 may not extend beyond the external boundaries of the semiconductor package 20. Accordingly, in this situation the thermal interface material 150 actually transfers the heat generated from the semiconductor package 20 to only a portion of the cover 30, which vertically overlaps the semiconductor package 20.

Because the semiconductor apparatus 1 according to an example embodiment of the inventive concept includes the conductive label 100, the semiconductor package 20 may be thermally coupled, by the conductive label 100, to the second cover portion 30b of the cover 30, which does not vertically overlap the semiconductor package 20, and the thermal coupling between the semiconductor package 20 and the cover 30 may be enhanced. Therefore, the heat generated from the semiconductor package 20 may be transferred to the portion of the cover 30, which does not vertically overlap the semiconductor package 20, and may be quickly discharged to the outside of the semiconductor apparatus 1.

Figure 4:
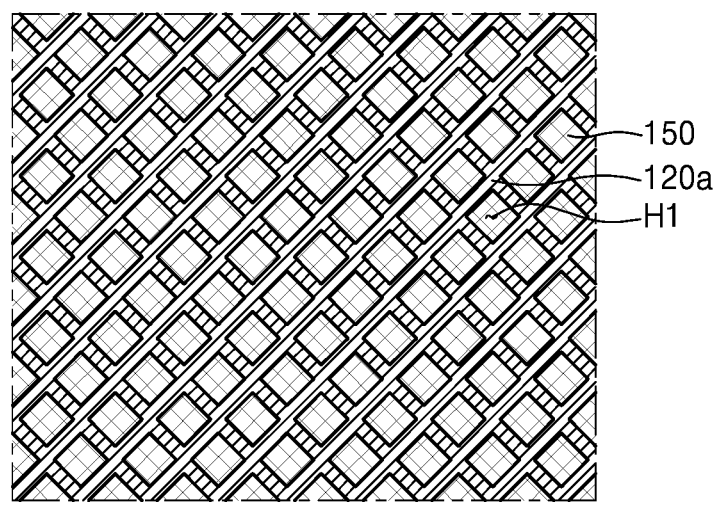
FIG. 4 is a cross-sectional view of a conductive layer of the semiconductor apparatus of FIG. 3, taken along a line IV-IV' of FIG. 3, according to an example embodiment of the inventive concept.

FIG. 4 is a cross-sectional view of the first conductive portion 120a of the semiconductor apparatus 1 of FIG. 3, taken along a line IV-IV' of FIG. 3, according to an example embodiment of the inventive concept.

Referring to FIG. 4 together with FIG. 3, a first hole H1 (e.g., plurality of first holes H1) may be formed in the first conductive portion 120a. More specifically, a plurality of first holes H1 of mesh types may be formed in the conductive layer 120 vertically overlapping the semiconductor package 20. The thermal interface material 150 may be arranged in the first holes H1, so that the first holes H1 are filled with the thermal interface material 150. In this embodiment, side surfaces of first conductive portion 120a of the conductive layer 120 (e.g., surfaces that extend vertically), as well as side surfaces of the conductive label 100 that includes the side surfaces of the first conductive portion 120a of the conductive layer 120, contact the thermal interface material 150. These side surfaces of the conductive label 100 or conductive layer 120 may be described as vertically-extending surfaces.

In addition, a second hole (e.g., second holes, not shown) may be formed in the first adhesive layer 110, the second hole vertically overlapping the first hole H1 of the first conductive portion 120a. Because the thermal interface material 150 may be arranged in the first hole H1 and the second hole, a portion of the thermal interface material 150 may contact the top surface of the semiconductor package 20. Each combined first hole H1 and second hole may be described generally as a hole in the conductive label 100.

More specifically, the thermal interface material 150 may include a phase-change material as described above, and thus, the thermal interface material 150 may be arranged in the first hole H1 and the second hole. For example, the thermal interface material 150 may flow into the first hole H1 and the second hole while in a liquid state. After the thermal interface material 150 flows into the first hole H1 and the second hole, the thermal interface material 150 may be coagulated into a solid state.

Because the portion of the thermal interface material 150 may contact the top surface of the semiconductor package 20, some of the heat generated from the semiconductor package 20 may be quickly transferred to the cover 30 that overlaps the semiconductor package 20 in a plan view, while some of the heat may still be transferred to a region of the cover 30 outside of the semiconductor package 20 from a plan view. Therefore, the heat dissipation performance of the semiconductor apparatus 1 may be improved. The hole structure shown in FIG. 4 can also be applied to the other embodiments herein that include a thermal interface material connected to a conductive layer, such as described in FIGS. 5, 6, and 13-16.

Figure 5:
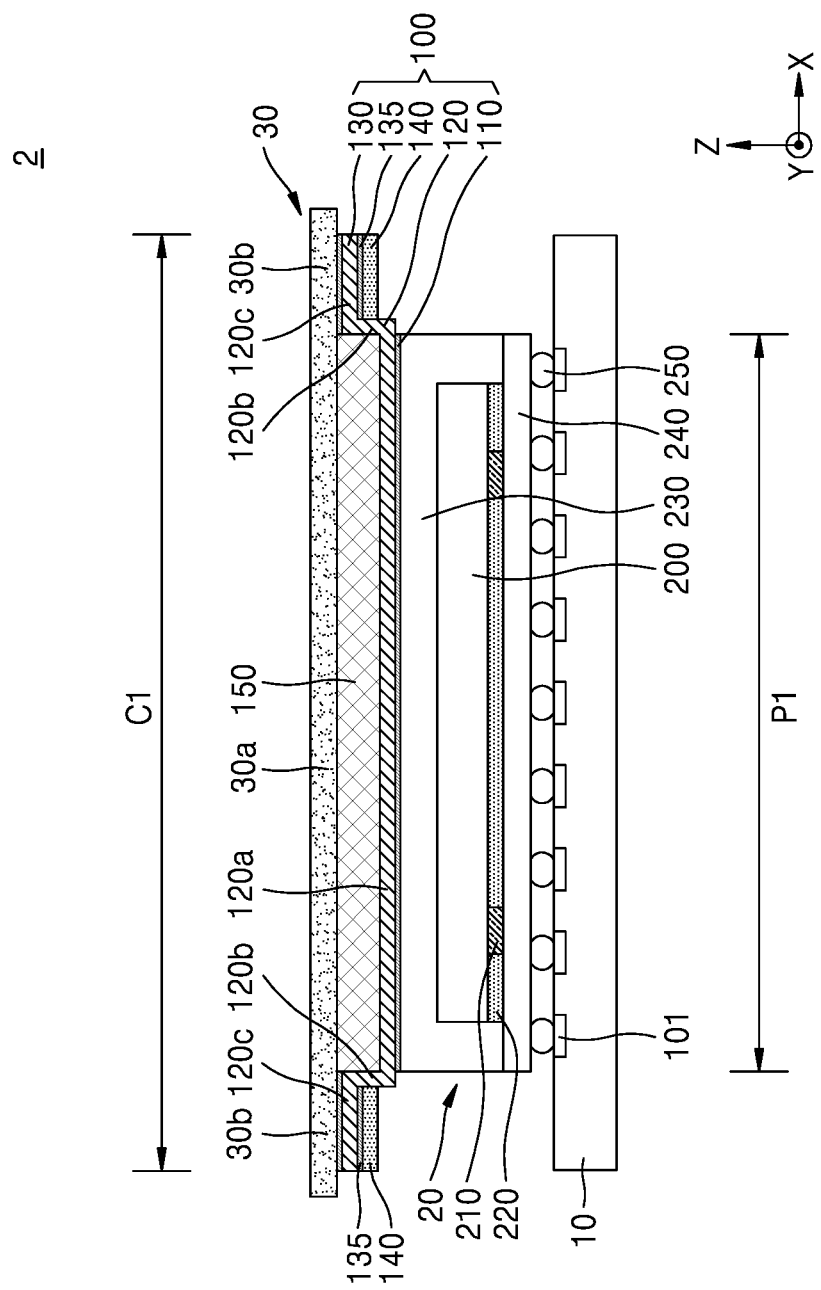
FIG. 5 is a cross-sectional view of a semiconductor apparatus according to an example embodiment of the inventive concept.

FIG. 5 is a cross-sectional view of a semiconductor apparatus 2 according to an example embodiment of the inventive concept. Hereinafter, repeated descriptions between the semiconductor apparatus 1 of FIG. 3 and the semiconductor apparatus 2 of FIG. 5 will be omitted, and differences therebetween will be mainly described.

Referring to FIG. 5, the conductive label 100 of the semiconductor apparatus 2 according to an example embodiment of the inventive concept may further include a third adhesive layer 135 and an insulating layer 140.

In an example embodiment, the third adhesive layer 135 may attach the insulating layer 140 to the third conductive portion 120c. The third adhesive layer 135 may be arranged between the third conductive portion 120c and the insulating layer 140.

The insulating layer 140 may be a layer attached to a lower portion of the third conductive portion 120c by the third adhesive layer 135 and including an electrically insulating material. The insulating layer 140 may be attached to a portion of the conductive layer 120, which does not vertically overlap the semiconductor package 20.

In addition, the insulating layer 140 may be attached to the portion of the conductive layer 120 to face the system substrate 10. Therefore, the insulating layer 140 may suppress short circuits from occurring by preventing contact between the third conductive portion 120c of the conductive layer 120 and the system substrate 10.

Figure 6:
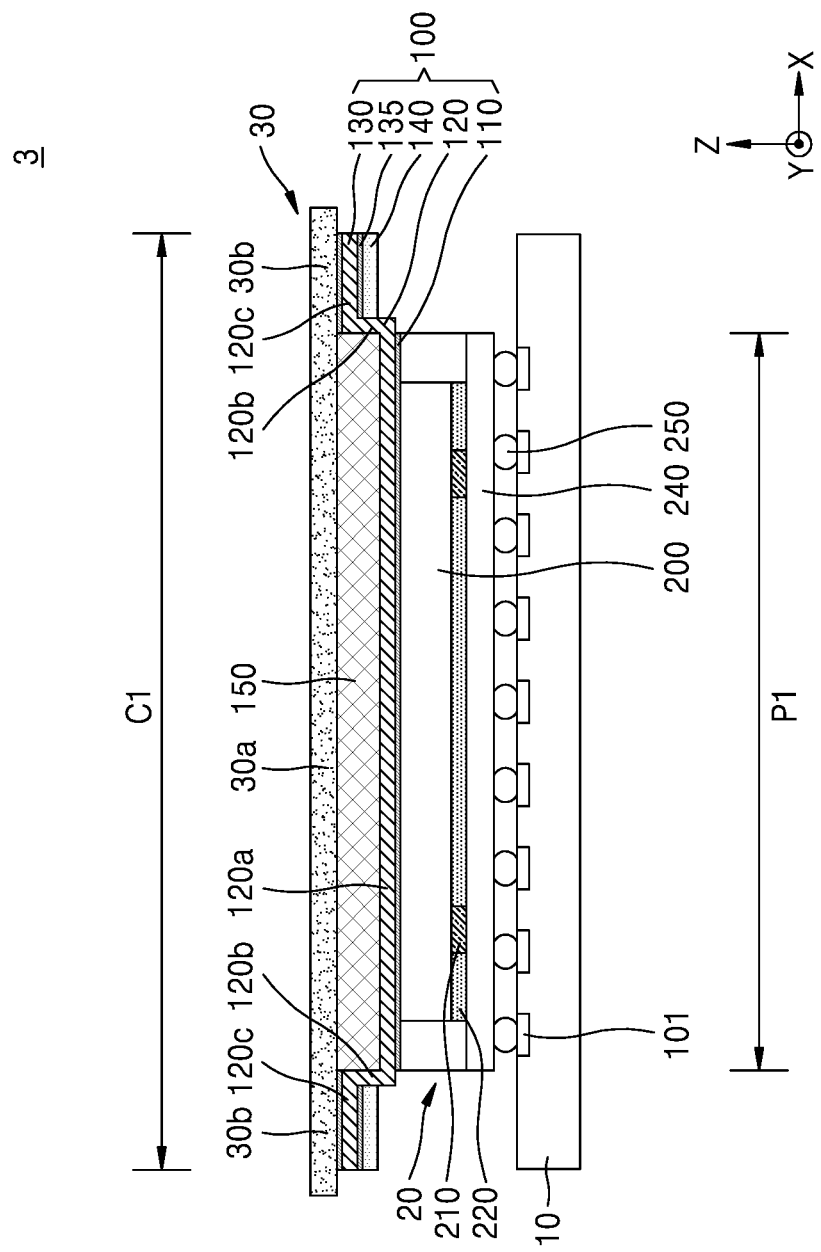
FIG. 6 is a cross-sectional view of a semiconductor apparatus according to an example embodiment of the inventive concept.

FIG. 6 is a cross-sectional view of a semiconductor apparatus 3 according to an example embodiment of the inventive concept. Hereinafter, repeated descriptions between the semiconductor apparatus 2 of FIG. 5 and the semiconductor apparatus 3 of FIG. 6 will be omitted, and differences therebetween will be mainly described.

Referring to FIG. 6, the top surface of the semiconductor chip 200 of the semiconductor apparatus 3 may be at substantially the same level as a top surface of the molding layer 230. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise. The top surface of the semiconductor chip 200 may be exposed with respect to the molding layer 230 and may contact the conductive label 100. Therefore, because heat generated from the semiconductor chip 200 may be quickly transferred to the conductive label 100, the heat dissipation performance of the semiconductor apparatus 3 may be improved. Though FIG. 6 shows the insulating layer 140 and third adhesive layer 135 of FIG. 5, the package configuration shown in FIG. 6 can be used for embodiments that do not include insulating layer 140 or third adhesive layer 135, or for other of the various embodiments described herein.

Figure 7:
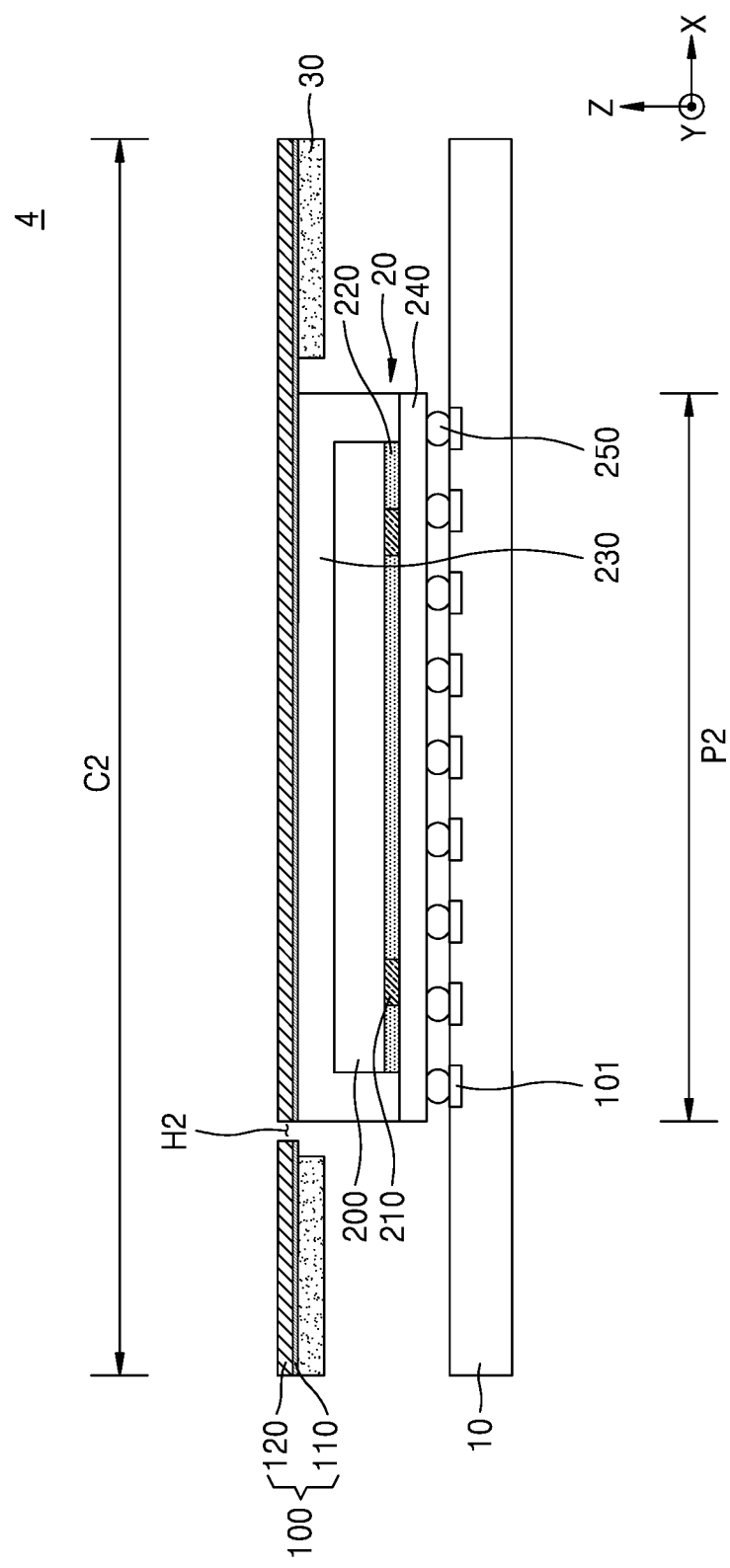
FIG. 7 is a cross-sectional view of a semiconductor apparatus according to an example embodiment of the inventive concept.

FIG. 7 is a cross-sectional view of a semiconductor apparatus 4 according to an example embodiment of the inventive concept.

Referring to FIG. 7, the semiconductor apparatus 4 according to an example embodiment of the inventive concept may include the system substrate 10, the semiconductor package 20, the cover 30, and the conductive label 100.

In an example embodiment, the top surface of the semiconductor package 20 may not be covered by the cover 30 and may be exposed with respect to the cover 30, and the cover 30 may surround the side surface of the semiconductor package 20. In an example embodiment, the inner surface of the cover 30 may be at a lower level (e.g., a lower height from a top surface of the system substrate 10 in a direction perpendicular to the top surface of the system substrate 10) than the top surface of the semiconductor package 20. In addition, an outer surface of the cover 30 may be at substantially the same level as the top surface of the semiconductor package 20. However, the inventive concept is not limited thereto.

In an example embodiment, a horizontal (e.g., X-direction) length C2 of the conductive label 100 may be greater than a horizontal (e.g., X-direction) length P2 of the semiconductor package 20. In addition, the conductive label 100 may be attached to the top surface of the semiconductor package 20 and the outer surface of the cover 30. The conductive label 100 in this embodiment may have a flat plate shape, different from the bent plate shape described in connection with FIGS. 3-6.

More specifically, the conductive label 100 may include the first adhesive layer 110 and the conductive layer 120. In an example embodiment, the first adhesive layer 110 may contact the top surface of the semiconductor package 20 and the outer surface of the cover 30. In addition, the first adhesive layer 110 may attach the conductive layer 120 to the top surface of the semiconductor package 20 and the outer surface of the cover 30.

In an example embodiment, the conductive layer 120 may transfer the heat generated from the semiconductor package 20 to the cover 30. The conductive layer 120 may be arranged on the first adhesive layer 110 and may be exposed to the outside of the semiconductor apparatus 4. The conductive layer 120 may discharge the heat, which is transferred from the semiconductor package 20, to the outside of the semiconductor apparatus 4.

The heat generated from the semiconductor package 20 may be transferred, by the conductive layer 120, up to a portion of the cover 30, which does not vertically overlap the semiconductor package 20. Therefore, the heat dissipation performance of the semiconductor apparatus 4 may be improved.

In an example embodiment, a vent hole H2 may be formed in a portion of the conductive label 100, which vertically overlaps a horizontal separation space between the semiconductor package 20 and the cover 30 (e.g., a gap between the semiconductor package 20 and the cover 30). The vent hole H2 may be formed in the portion of the conductive label 100, which does not vertically overlap the semiconductor package 20 and the cover 30. Two or more vent holes H2 may be formed. The vent hole H2 may form a combined hole with (e.g., may vertically overlap) the separation space between the semiconductor package 20 and the cover 30. The vent hole H2 may have equal length sides (e.g., it may be circular, square, etc.) or may be elongated in shape. For example, portions of the cover 30 may contact a side surface of the semiconductor package 20, while portions are separated from a side surface of the semiconductor package 20 by one or more holes H2.

Air flowing into the semiconductor apparatus 4 through the vent hole H2 of the conductive label 100 may circulate around the semiconductor package 20 and then be discharged out of the semiconductor apparatus 4 through the vent hole H2. The heat generated from the semiconductor package 20 may be quickly discharged out of the semiconductor apparatus 4 due to thermal convection by air. Therefore, the heat dissipation performance of the semiconductor apparatus 4 may be improved.

Figure 8:
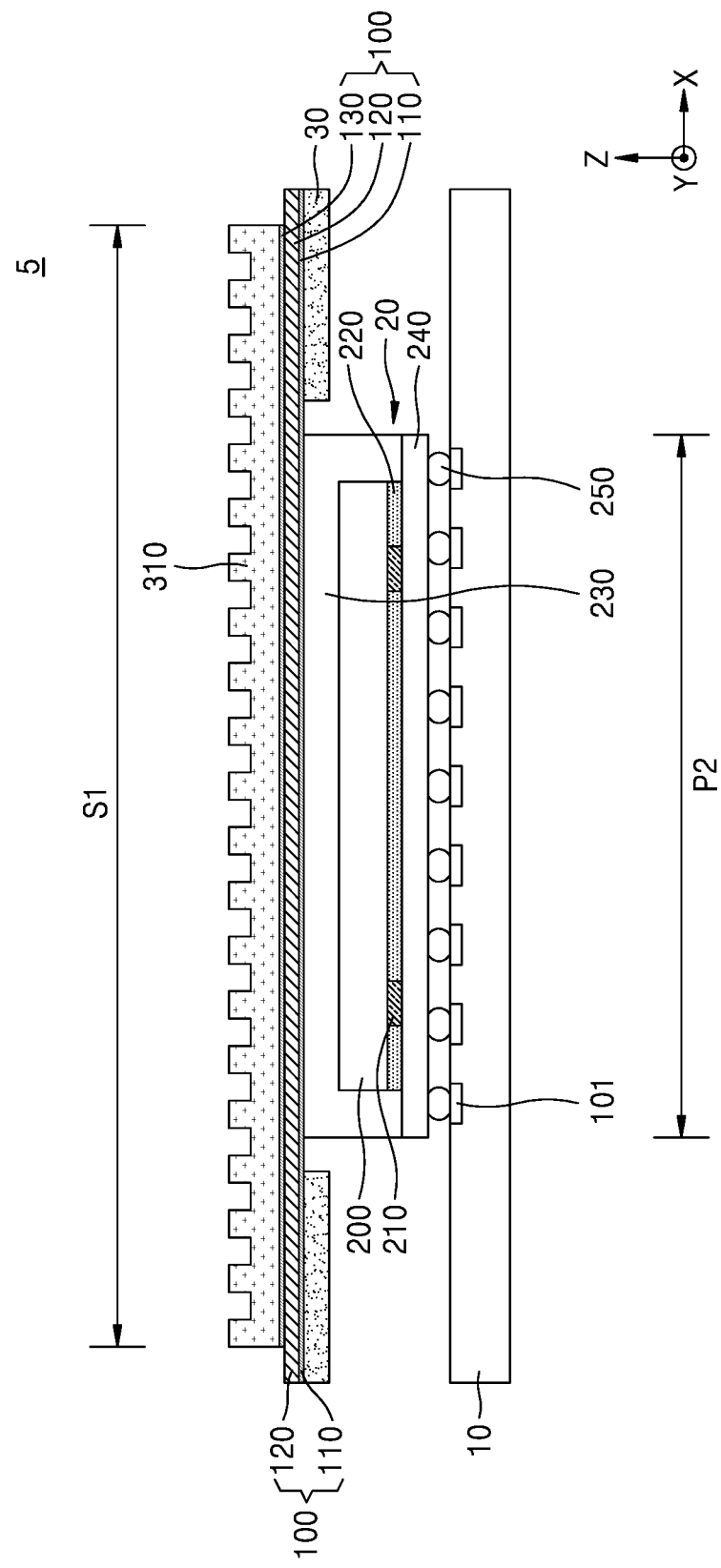
FIG. 8 is a cross-sectional view of a semiconductor apparatus according to an example embodiment of the inventive concept.

FIG. 8 is a cross-sectional view of a semiconductor apparatus 5 according to an example embodiment of the inventive concept. Hereinafter, repeated descriptions between the semiconductor apparatus 4 of FIG. 7 and the semiconductor apparatus 5 of FIG. 8 will be omitted, and differences therebetween will be mainly described.

Referring to FIG. 8, the conductive label 100 of the semiconductor apparatus 5 according to an example embodiment of the inventive concept may further include the second adhesive layer 130. The second adhesive layer 130 may attach a heat sink 310 onto the conductive layer 120.

The heat sink 310 may be a heat dissipation member, which receives the heat generated from the semiconductor package 20 and discharges the heat out of the semiconductor apparatus 5. The heat sink 310 may be attached onto the conductive layer 120 by the second adhesive layer 130 and may be exposed to the outside of the semiconductor apparatus 5.

In an example embodiment, a horizontal (e.g., X-direction) length S1 of the heat sink 310 may be greater than the horizontal (e.g., X-direction) length P2 of the semiconductor package 20. For example, the horizontal (e.g., X-direction) length S1 of the heat sink 310 may be greater than the horizontal (e.g., X-direction) length P2 of the semiconductor package 20 and less than a horizontal (e.g., X-direction) length of the conductive layer 120. However, the inventive concept is not limited thereto, and the horizontal (e.g., X-direction) length S1 of the heat sink 310 may be greater than the horizontal (e.g., X-direction) length P2 of the semiconductor package 20 and substantially equal to the horizontal (e.g., X-direction) length of the conductive layer 120. Though only the horizontal X-direction is shown in the various embodiments herein, the same length relationship may occur in the Y-direction between the semiconductor package 20, the conductive layer 120 (and heat sink 310 in the embodiment of FIG. 8) as described herein in connection with the X-direction.

The heat sink 310 may include a material having excellent thermal conductivity. In an example embodiment, the heat sink 310 includes a metal material having excellent thermal conductivity. For example, the heat sink 310 may include a metal material such as copper (Cu), gold (Au), silver (Ag), aluminum (Al), magnesium (Mg), or nickel (Ni).

In addition, the heat sink 310 may include a carbon-based material having excellent thermal conductivity. For example, the heat sink 310 may include graphite, diamond, carbon fibers, or the like. In addition, the heat sink 310 may include a polymeric material having excellent thermal conductivity. However, the heat sink 310 is not limited to the materials set forth above and may include combinations of the materials set forth above or include other materials not mentioned above.

In an example embodiment, the heat sink 310 may have a concavo-convex structure to increase a surface area thereof exposed to the outside of the semiconductor apparatus 5. Therefore, the semiconductor apparatus 5 may quickly discharge the heat generated from the semiconductor package 20 to the outside of the semiconductor apparatus 5.

In addition, information of the semiconductor package 20 may be marked on a surface of the heat sink 310. For example, pieces of information of the semiconductor package 20, such as the type of semiconductor chip 200, the number of semiconductor chips 200 (e.g., if there are a stack of semiconductor chips 200 in the semiconductor package 20, or an array or row of semiconductor chips 200, in one package or in a plurality of packages, aligned in a horizontal direction), the performance of the semiconductor chip 200, the name and/or logo of the manufacturer thereof, the manufacturing date thereof, and the serial number thereof, may be marked on the surface of the heat sink 310. For example, the pieces of information of the semiconductor package 20 may be marked on the surface of the heat sink 310 by a laser etching method. However, the inventive concept is not limited thereto, and the pieces of information of the semiconductor package 20 may be marked on the surface of the heat sink 310 by a pad printing method.

Figure 9:
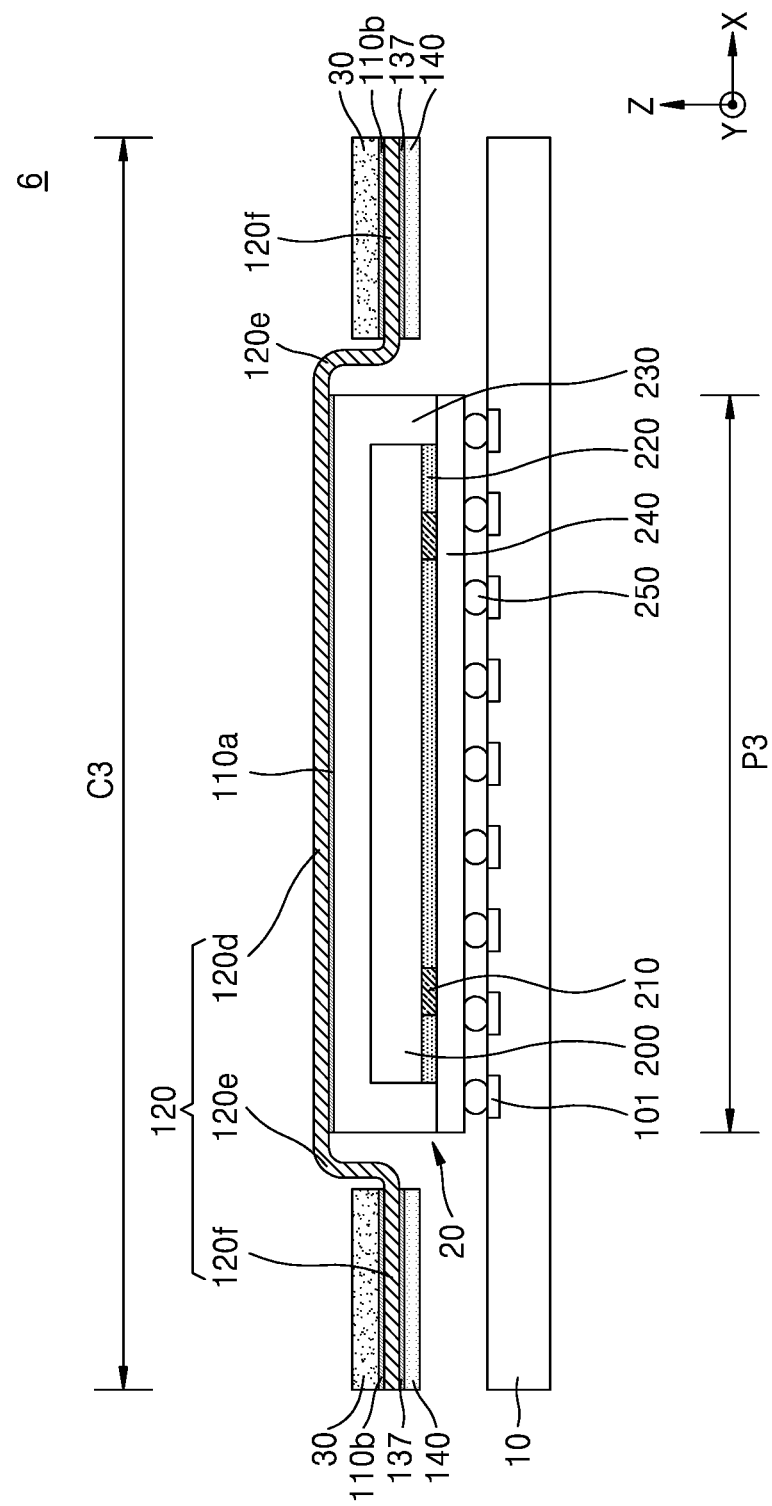
FIG. 9 is a cross-sectional view of a semiconductor apparatus according to an example embodiment of the inventive concept.

FIG. 9 is a cross-sectional view of a semiconductor apparatus 6 according to an example embodiment of the inventive concept. Hereinafter, repeated descriptions between the semiconductor apparatus 4 of FIG. 7 and the semiconductor apparatus 6 of FIG. 9 will be omitted, and differences therebetween will be mainly described.

Referring to FIG. 9, a bottom surface of the cover 30 may be at a lower level than the top surface of the semiconductor package 20. In addition, the top surface of the semiconductor package 20 may be at a higher level than a top surface of the cover 30. That is, the semiconductor package 20 may protrude from the outer surface of the cover 30.

The conductive label 100 may include a first adhesive layer 110a, a second adhesive layer 110b, the conductive layer 120, a third adhesive layer 137, and the insulating layer 140. In an example embodiment, the first adhesive layer 110a may contact the top surface of the semiconductor package 20. In addition, the first adhesive layer 110a may attach the conductive layer 120 to the top surface of the semiconductor package 20. The first adhesive layer 110a may vertically overlap the semiconductor package 20.

The second adhesive layer 110b may contact a surface of the conductive layer 120, which does not vertically overlap the semiconductor package 20, and the inner surface of the cover 30. The second adhesive layer 110b may attach the conductive layer 120 to the inner surface of the cover 30.

A horizontal (e.g., X-direction) length C3 of the conductive layer 120 may be greater than a horizontal (e.g., X-direction) length P3 of the semiconductor package 20. The conductive layer may be partially arranged over the semiconductor package 20 and partially arranged under the cover 30. The heat generated from the semiconductor package 20 may be transferred to the cover 30 by the conductive layer 120.

In an example embodiment, the conductive layer 120 may include a first conductive portion 120d, a second conductive portion 120e, and a third conductive portion 120f. The first conductive portion 120d may be a portion of the conductive layer 120, which is attached to the top surface of the semiconductor package 20 by the first adhesive layer 110a. In addition, the first conductive portion 120d may be a portion of the conductive layer 120, which vertically overlaps the semiconductor package 20.

The second conductive portion 120e may be a portion of the conductive layer 120, which is bent downward from the first conductive portion 120d and covers a separation space between the semiconductor package 20 and the cover 30. As one example, the second conductive portion 120e may be inclined between the semiconductor package 20 and the cover 30.

The third conductive portion 120f may be a portion of the conductive layer 120, which laterally extends from the second conductive portion 120e and is attached to the inner surface of the cover 30 by the second adhesive layer 110b. In addition, the third conductive portion 120f may be a portion of the conductive layer 120, which does not vertically overlap the semiconductor package 20.

In an example embodiment, the third adhesive layer 137 may attach the insulating layer 140 to a portion of the conductive layer 120, which faces the system substrate 10. More specifically, the third adhesive layer 137 may contact the third conductive portion 120f and may attach the insulating layer 140 to the third conductive portion 120f.

In an example embodiment, the insulating layer 140 may be a layer for suppressing short circuits from occurring by preventing contact between the conductive layer 120 and the system substrate 10. The insulating layer 140 may be attached to the third conductive portion 120f by the third adhesive layer 137. In addition, the insulating layer 140 may not vertically overlap the semiconductor package 20 and may face the system substrate 10.

Figure 10:
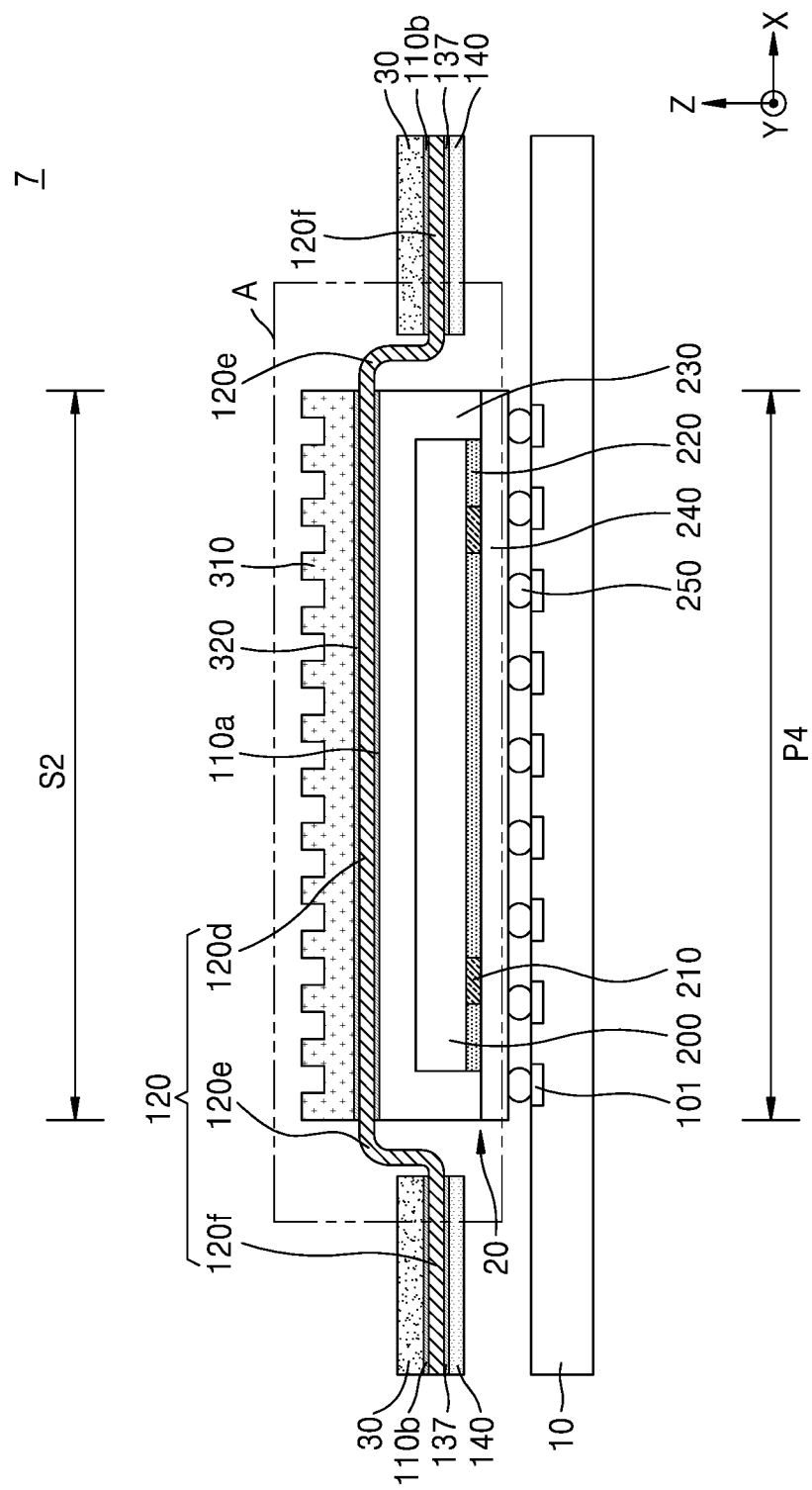
FIG. 10 is a cross-sectional view of a semiconductor apparatus according to an example embodiment of the inventive concept.

FIG. 10 is a cross-sectional view of a semiconductor apparatus 7 according to an example embodiment of the inventive concept. In addition, FIG. 11 is a plan view of a region A of the semiconductor apparatus 7 of FIG. 10.

Figure 11:
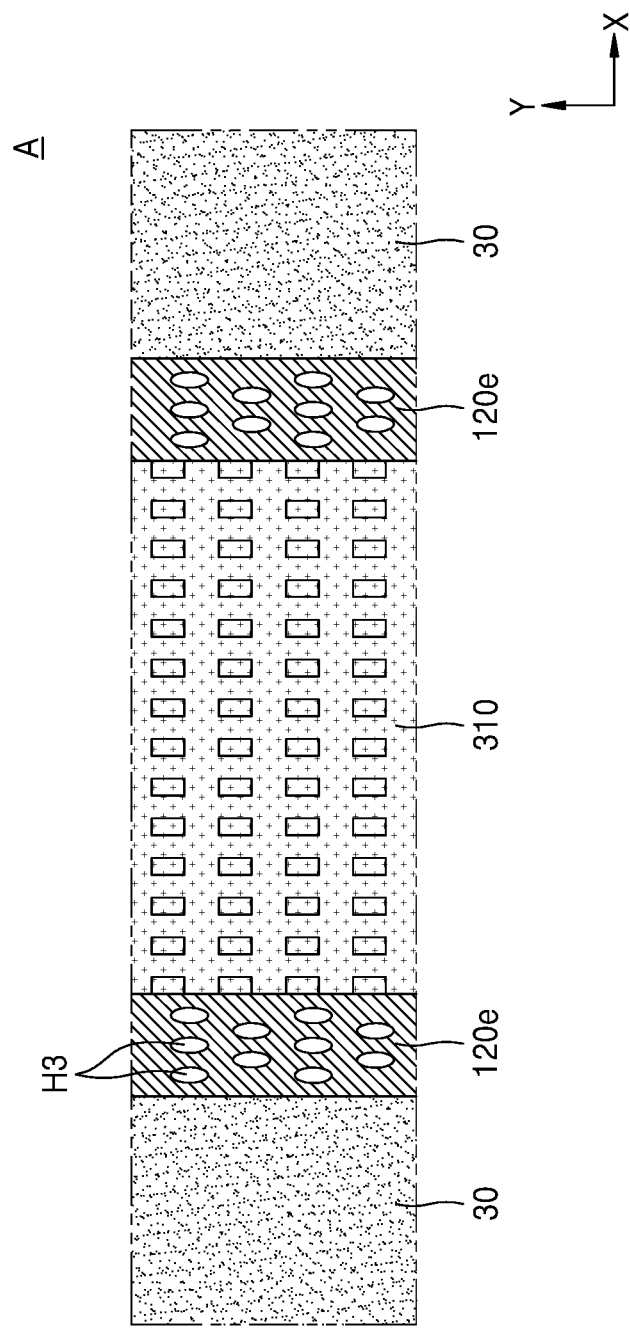
FIG. 11 is a plan view of a region A of the semiconductor apparatus of FIG. 10, according to an example embodiment of the inventive concept.

Referring to FIGS. 10 and 11, the semiconductor apparatus 7 of the inventive concept may further include the heat sink 310. The heat sink 310 may be a heat dissipation member, which receives the heat generated from the semiconductor package 20 and discharges the heat to the outside of the semiconductor apparatus 7.

In an example embodiment, a fourth adhesive layer 320 may contact a top surface of the first conductive portion 120d and may attach the heat sink 310 to the first conductive portion 120d. The heat sink 310 may be attached to the first conductive portion 120d by the fourth adhesive layer 320 and may be exposed to the outside of the semiconductor apparatus 7.

In an example embodiment, a horizontal (e.g., X-direction) length S2 of the heat sink 310 may be substantially equal to a horizontal (e.g., X-direction) length P4 of the semiconductor package 20. However, the inventive concept is not limited thereto, and the horizontal (e.g., X-direction) length S2 of the heat sink 310 may be less than the horizontal (e.g., X-direction) length P4 of the semiconductor package 20.

Descriptions of the material and shape of the heat sink 310 are the same as those given with reference to FIG. 8 and thus will be omitted.

In an example embodiment, a vent hole H3 may be formed in the conductive layer 120, the vent hole H3 allowing air to flow into the semiconductor apparatus 7 or to flow out of the semiconductor apparatus 7. The vent hole H3 may be formed in a portion of the conductive layer 120, which vertically overlaps the separation space between the semiconductor package 20 and the cover 30. For example, the vent hole H3 may be formed in the second conductive portion 120*e*. Two or more vent holes H3 may be formed.

Air flowing into the semiconductor apparatus 7 through the vent hole H3 of the conductive label 100 may circulate around the semiconductor package 20 and then be discharged out of the semiconductor apparatus 7 through the vent hole H3. The heat generated from the semiconductor package 20 may be quickly discharged out of the semiconductor apparatus 7 due to thermal convection by air. Therefore, the heat dissipation performance of the semiconductor apparatus 7 may be improved.

Figure 12:
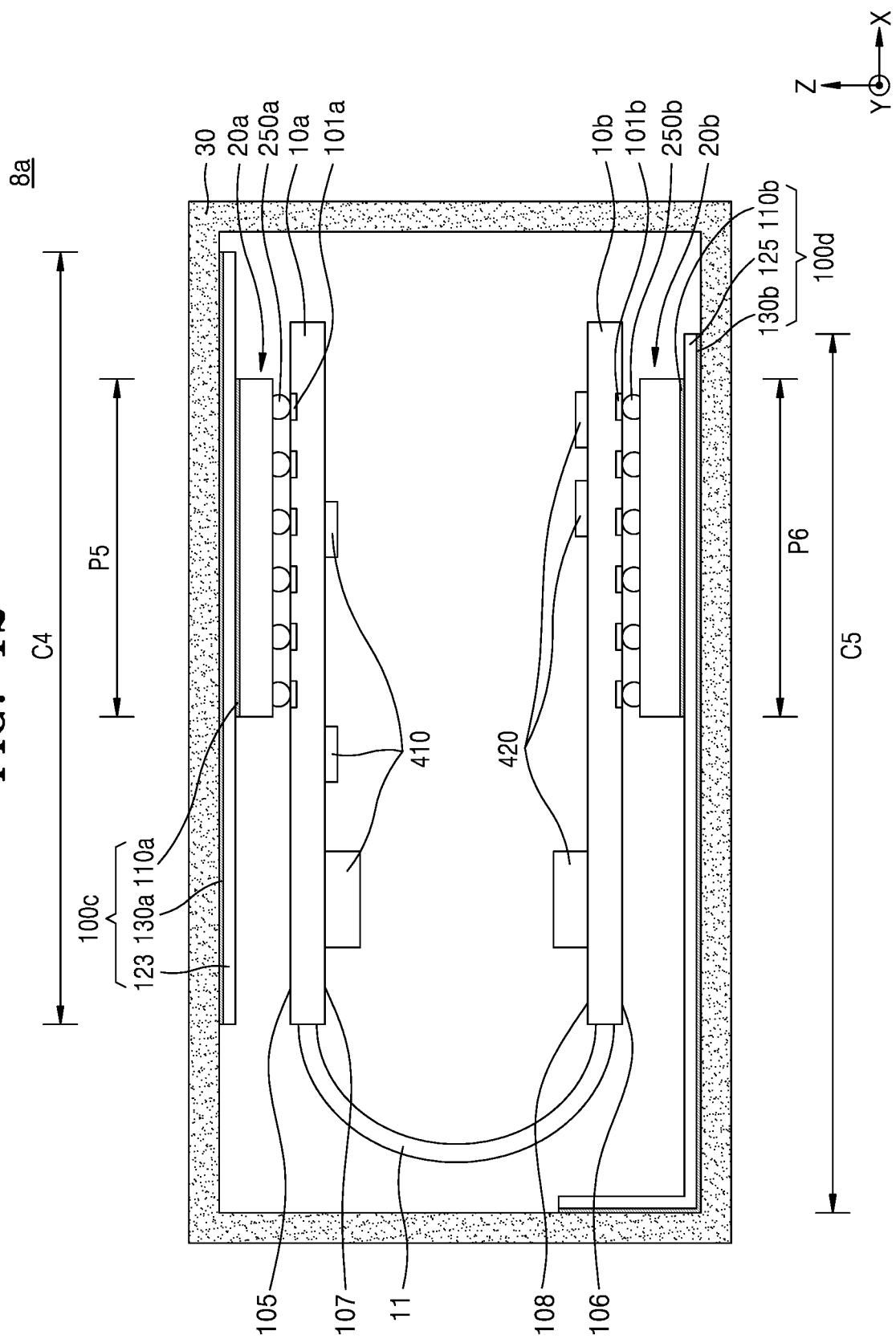
FIG. 12 is a cross-sectional view of a semiconductor apparatus according to an example embodiment of the inventive concept.

FIG. 12 is a cross-sectional view of a semiconductor apparatus 8*a* according to an example embodiment of the inventive concept.

Referring to FIG. 12, the semiconductor apparatus 8*a* according to an example embodiment of the inventive concept may include a first system substrate 10*a*, a second system substrate 10*b*, a flexible substrate 11, a first semiconductor package 20*a*, a second semiconductor package 20*b*, the cover 30, a first conductive label 100*c*, and a second conductive label 100*d*.

The first system substrate 10*a* may be a substrate on which the first semiconductor package 20*a* is mounted. The first system substrate 10*a* may include first substrate pads 101*a* contacting respective first package connection terminals 250*a* of the first semiconductor package 20*a*. In an example embodiment, the first system substrate 10*a* may be a double-sided PCB including substrate pads on both surfaces thereof. However, the inventive concept is not limited thereto, and the first system substrate 10*a* may be a single-sided PCB including the first substrate pad 101*a* on only one surface thereof.

In an example embodiment, the first system substrate 10*a* may include a first mounting surface 105 and a second mounting surface 107 opposite to the first mounting surface 105. The first mounting surface 105 may be a surface of the first system substrate 10*a*, which faces the inner surface of the cover 30 closest thereto, and the first semiconductor package 20*a* may be mounted on the first mounting surface 105. In addition, the second mounting surface 107 may be a surface of the first system substrate 10*a*, which faces the second system substrate 10*b*, and a plurality of first electronic modules 410 may be mounted on the second mounting surface 107. For example, the first electronic modules 410 may include passive elements, active elements, and the like.

In general, the amount of heat emitted from the first semiconductor package 20*a* mounted on the first mounting surface 105 of the first system substrate 10*a* may be greater than the amount of heat emitted from the first electronic modules 410 mounted on the second mounting surface 107 of the first system substrate 10*a*. Accordingly, when the first semiconductor package 20*a* is mounted on the first mounting surface 105, the heat emitted from the first semiconductor package 20*a* may be quickly discharged out of the semiconductor apparatus 8*a* through the cover 30.

However, the inventive concept is not limited thereto and, when the amount of heat emitted from the first electronic modules 410 is greater than the heat emitted from the first semiconductor package 20*a*, the first electronic modules 410 may be mounted on the first mounting surface 105 of the first system substrate 10*a*, and the first semiconductor package 20*a* may be mounted on the second mounting surface 107 of the first system substrate 10*a*.

The second system substrate 10*b* may be a substrate on which the second semiconductor package 20*b* is mounted. The second system substrate 10*b* may include second substrate pads 101*b* contacting respective second package connection terminals 250*b* of the second semiconductor package 20*b*. In an example embodiment, the second system substrate 10*b* may be a double-sided PCB including substrate pads on both surfaces thereof. However, the inventive concept is not limited thereto, and the second system substrate 10*b* may be a single-sided PCB including the second substrate pad 101*b* on only one surface thereof.

In an example embodiment, the second system substrate 10*b* may include a third mounting surface 106 and a fourth mounting surface 108 opposite to the third mounting surface 106. The third mounting surface 106 may be a surface of the second system substrate 10*b*, which faces the inner surface of the cover 30 closest thereto, and the second semiconductor package 20*b* may be mounted on the third mounting surface 106. In addition, the fourth mounting surface 108 may be a surface of the second system substrate 10*b*, which faces the first system substrate 10*a*, and a plurality of second electronic modules 420 may be mounted on the fourth mounting surface 108. For example, the second electronic modules 420 may include passive elements, active elements, and the like. In addition, the second mounting surface 107 of the first system substrate 10*a* and the fourth mounting surface 108 of the second system substrate 10*b* may face each other.

In general, the amount of heat emitted from the second semiconductor package 20*b* mounted on the third mounting surface 106 of the second system substrate 10*b* may be greater than the amount of heat emitted from the second electronic modules 420 mounted on the fourth mounting surface 108 of the second system substrate 10*b*. Accordingly, when the second semiconductor package 20*b* is mounted on the third mounting surface 106, the heat emitted from the second semiconductor package 20*b* may be quickly discharged out of the semiconductor apparatus 8*a* through the cover 30.

However, the inventive concept is not limited thereto and, when the amount of heat emitted from the second electronic modules 420 is greater than the heat emitted from the second semiconductor package 20*b*, the second electronic modules 420 may be mounted on the third mounting surface 106 of the second system substrate 10*b*, and the second semiconductor package 20*b* may be mounted on the fourth mounting surface 108 of the second system substrate 10*b*.

In an example embodiment, the flexible substrate 11 may be a substrate physically and/or electrically connecting the first system substrate 10*a* to the second system substrate 10*b*. In addition, the flexible substrate 11 may be a substrate having flexibility.

In an example embodiment, the flexible substrate 11 may have a thickness of about 300 μm or less to ensure the flexibility thereof. However, the inventive concept is not limited thereto, and the flexible substrate 11 may have various thicknesses. In addition, the flexible substrate 11 may have a curved shape to connect the first system substrate 10a to the second system substrate 10b in a limited internal space provided by the cover 30.

In an example embodiment, the flexible substrate 11 may include at least one of polyimide (PI), polyethylene naphthalate (PEN), polyethylene terephthalate (PET), polyether ether ketone (PEEK), and prepreg.

The cover 30 may surround the first system substrate 10a, the second system substrate 10b, the flexible substrate 11, the first semiconductor package 20a, and the second semiconductor package 20b to protect the first system substrate 10a, the second system substrate 10b, the flexible substrate 11, the first semiconductor package 20a, and the second semiconductor package 20b from an external impact.

In an example embodiment, the cover 30 may be a case for packing the first system substrate 10a, the second system substrate 10b, the flexible substrate 11, the first semiconductor package 20a, and the second semiconductor package 20b. However, the inventive concept is not limited thereto, and the cover 30 may be a heat dissipation member for discharging heat generated from the first semiconductor package 20a and the second semiconductor package 20b. Though not shown, the cover 30 may have openings therein through which the first semiconductor package 20a and second semiconductor package 20b communicate to electrically connect to an external device or system.

In an example embodiment, the cover 30 may include a material having excellent thermal conductivity to quickly discharge the heat generated from the first semiconductor package 20a and the second semiconductor package 20b to the outside of the semiconductor apparatus 8a. For example, the cover 30 may include a metal material such as copper (Cu), gold (Au), silver (Ag), aluminum (Al), magnesium (Mg), or nickel (Ni). However, the inventive concept is not limited thereto, and the cover 30 may include a carbon-based material having excellent thermal conductivity, such as graphite, diamond, or carbon fibers.

The first semiconductor package 20a may be a package including a first semiconductor chip (not shown). For example, the first semiconductor package 20a may include two or more first semiconductor chips. The first semiconductor chips included in the first semiconductor package 20a may be of the same type or be of different types. In addition, the first semiconductor package 20a may include first package connection terminals 250a contacting the first system substrate 10a. Further, the first semiconductor package 20a may have a first length P5 in the horizontal direction (e.g., X direction).

In an example embodiment, the first semiconductor chip may include a first semiconductor device layer, and a plurality of individual devices of various types may be formed in the first semiconductor device layer. The first semiconductor device layer may be connected to the first system substrate 10a via the first package connection terminals 250a.

The second semiconductor package 20b may be a package including a second semiconductor chip (not shown). For example, the second semiconductor package 20b may include two or more second semiconductor chips. The second semiconductor chips included in the second semiconductor package 20b may be of the same type or be of different types. In addition, the second semiconductor package 20b may include a second package connection terminal 250b contacting the second system substrate 10b. Further, the second semiconductor package 20b may have a second length P6 in the horizontal direction (e.g., X direction).

In an example embodiment, the first semiconductor package 20a and the second semiconductor package 20b may be electrically connected to each other and may be operated as one system. More specifically, the first semiconductor package 20a and the second semiconductor package 20b may be electrically connected to each other via the first system substrate 10a, the second system substrate 10b, and the flexible substrate 11 and thus be operated as one system.

The first semiconductor chip included in the first semiconductor package 20a may be of different type from that of the second semiconductor chip included in the second semiconductor package 20b. For example, the first semiconductor chip may include a memory semiconductor chip. For example, the first semiconductor chip may include a volatile memory semiconductor chip such as DRAM or SRAM, and may include a non-volatile memory semiconductor chip such as PRAM, MRAM, FeRAM, or RRAM.

In addition, the second semiconductor chip included in the second semiconductor package 20b may include a logic semiconductor chip. The second semiconductor chip may include, for example, a logic semiconductor chip such as a CPU, an MPU, a GPU, or an AP.

In an example embodiment, the first conductive label 100c may be arranged between the first semiconductor package 20a and the cover 30. In addition, a horizontal (e.g., X-direction) length C4 of the first conductive label 100c may be greater than a first length P5 of the first semiconductor package 20a in the horizontal direction (e.g., X direction). Accordingly, the first conductive label 100c may be attached even to the inner surface of the cover 30, which does not vertically overlap the first semiconductor package 20a. The first conductive label 100c may have a length C4 greater than 1.1 times the length P5 and less than the length of the semiconductor apparatus 8a in the X-direction. In some embodiments, the first conductive label 100c has a length C4 greater than 1.2 times the length P5 and less than and 5 times the length of P5.

The first conductive label 100c may include the first adhesive layer 110a, a first conductive layer 123, and a second adhesive layer 130a. The first adhesive layer 110a may contact a top surface of the first semiconductor package 20a and may vertically overlap the first semiconductor package 20a. The first adhesive layer 110a may attach the first conductive layer 123 to the top surface (e.g., inactive surface) of the first semiconductor package 20a.

The first conductive layer 123 may be attached to the top surface of the first semiconductor package 20a by the first adhesive layer 110a. The first conductive layer 123 may have a length C4 (e.g., which may be the same length as the first conductive label 100c) that is greater than the first length P5 of the first semiconductor package 20a, in the horizontal direction.

In an example embodiment, the first conductive layer 123 may be arranged between the first adhesive layer 110a and the second adhesive layer 130a. The heat generated from the first semiconductor package 20a may be transferred, by the first conductive layer 123, up to the inner surface of the cover 30, portions of which do not vertically overlap the first semiconductor package 20a.

The second adhesive layer 130a may be arranged between the cover 30 and the first conductive layer 123. The second adhesive layer 130a may attach the first conductive layer 123 to the inner surface of the cover 30.

In an example embodiment, the second conductive label 100d may be arranged between the second semiconductor package 20b and the cover 30. In addition, a fourth length C5 of the second conductive label 100d in the horizontal direction (e.g., X direction) may be greater than a second length P6 of the second semiconductor package 20b in the horizontal direction (e.g., X direction). Accordingly, the second conductive label 100d may be attached even to the inner surface of the cover 30, which does not vertically overlap the second semiconductor package 20b. The second conductive label 100d may have a length C5 greater than 1.1 times the length P6 and less than the length of the semiconductor apparatus 8a in the X direction. In some embodiments, the second conductive label 100d has a length C5 greater than 1.2 times the length P6 and less than and 5 times the length of P6 in the X direction. Part of the second conductive label 100d may also extend vertically to connect to a side wall of the cover 30, as shown in FIG. 12.

The second conductive label 100d may include the third adhesive layer 110b, a second conductive layer 125, and a fourth adhesive layer 130b. The third adhesive layer 110b may contact a top surface of the second semiconductor package 20b and may vertically overlap the second semiconductor package 20b. The third adhesive layer 110b may attach the second conductive layer 125 to the top surface of the second semiconductor package 20b.

The second conductive layer 125 may be attached to the top surface (e.g., an inactive surface) of the second semiconductor package 20b by the third adhesive layer 110b. The second conductive layer 125 may have a length C5 that is greater than the second length P6 of the second semiconductor package 20b, in the horizontal direction.

In an example embodiment, the second conductive layer 125 may be arranged between the third adhesive layer 110b and the fourth adhesive layer 130b. The heat generated from the second semiconductor package 20b may be transferred, by the second conductive layer 125, up to the inner surface of the cover 30, a portion of which does not vertically overlap the second semiconductor package 20b.

The fourth adhesive layer 130b may be arranged between the cover 30 and the second conductive layer 125. The fourth adhesive layer 130b may attach the second conductive layer 125 to the inner surface of the cover 30.

Because the semiconductor apparatus 8a according to an example embodiment of the inventive concept may include the first conductive label 100c between the first semiconductor package 20a and the cover 30 and the second conductive label 100d between the second semiconductor package 20b and the cover 30, the heat emitted from the first semiconductor package 20a and the second semiconductor package 20b may be quickly transferred to the cover 30. Therefore, the heat dissipation performance of the semiconductor apparatus 8a may be improved.

Spatially relative terms, such as "top," "bottom," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 13:
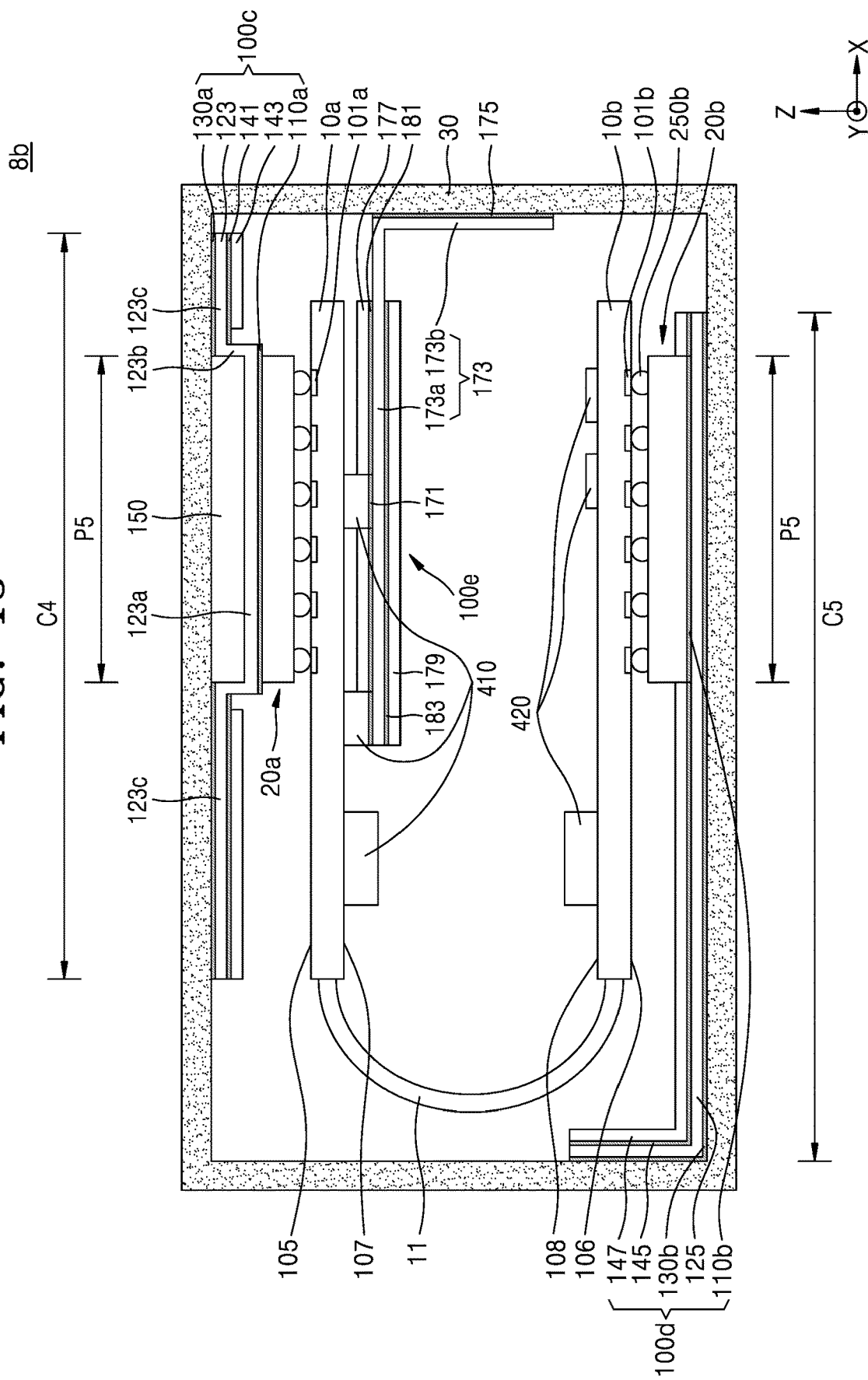
FIG. 13 is a cross-sectional view of a semiconductor apparatus according to an example embodiment of the inventive concept.

FIG. 13 is a cross-sectional view of a semiconductor apparatus 8b according to an example embodiment of the inventive concept. Hereinafter, repeated descriptions between the semiconductor apparatus 8a of FIG. 12 and the semiconductor apparatus 8b of FIG. 13 will be omitted, and differences therebetween will be mainly described.

Referring to FIG. 13, the thermal interface material 150 may be arranged over at least one of the first semiconductor package 20a and the second semiconductor package 20b. For example, as shown in FIG. 13, the thermal interface material 150 may be arranged over the first semiconductor package 20a, and the thermal interface material 150 may not be arranged over the second semiconductor package 20b. However, the inventive concept is not limited thereto, and the thermal interface material 150 may be arranged over both the first semiconductor package 20a and the second semiconductor package 20b.

In an example embodiment, the thermal interface material 150 may be arranged between the first conductive layer 123 and the cover 30. Descriptions of the thermal interface material 150 are the same as those given with reference to FIG. 3 and thus will be omitted. The first semiconductor package 20a of FIGS. 13-16 may also be the same as the semiconductor package 20 discussed previously, so details are omitted.

In an example embodiment, the first conductive layer 123 may include a first conductive portion 123a, a second conductive portion 123b, and a third conductive portion 123c. The first conductive portion 123a may be a portion of the first conductive layer 123, which vertically overlaps the first semiconductor package 20a and is arranged between the first adhesive layer 110a and the thermal interface material 150.

The second conductive portion 123b may be a portion of the first conductive layer 123, which is bent upward from the first conductive portion 123a and surrounds the side surface of the thermal interface material 150. In addition, the third conductive portion 123c may be a portion of the first conductive layer 123, which is laterally bent from the second conductive portion 123b and is attached, by the second adhesive layer 130a, to the inner surface of the cover 30 not vertically overlapping the first semiconductor package 20a.

In an example embodiment, the first conductive label 100c may optionally include a first insulating layer 143 under the third conductive portion 123c. More specifically, the first conductive label 100c may further include a fifth adhesive layer 141, which contacts one surface of the third conductive portion 123c, and the first insulating layer 143 attached to the third conductive portion 123c by the fifth adhesive layer 141. The first insulating layer 143 may be attached to the third conductive portion 123c to face the first mounting surface 105 of the first system substrate 10a.

In an example embodiment, the second conductive label 100d may optionally include a second insulating layer 147 over the second conductive layer 125. More specifically, the second conductive label 100d may further include a sixth adhesive layer 145, which contacts the second conductive layer 125, and the second insulating layer 147 attached to the second conductive layer 125 by the sixth adhesive layer 145. The second insulating layer 147 may be attached to the second conductive layer 125 to face the third mounting surface 106 of the second system substrate 10b.

In an example embodiment, the semiconductor apparatus 8b may further include a third conductive label 100e. The third conductive label 100e may include a seventh adhesive layer 171, a third conductive layer 173, and an eighth adhesive layer 175. The third conductive label 100e may be attached to at least one of the first electronic module 410 and the second electronic module 420, which have been described above.

In an example embodiment, the seventh adhesive layer 171 may contact a top surface of the first electronic module 410. The seventh adhesive layer 171 may attach the third conductive layer 173 to the top surface of the first electronic module 410.

The third conductive layer 173 may transfer heat generated from the first electronic module 410 to the cover 30. For example, the third conductive layer 173 may include a fourth conductive portion 173a, which extends in the horizontal direction, and a fifth conductive portion 173b, which is vertically bent from the fourth conductive portion 173a and is attached to the inner surface of the cover 30 (e.g., an inner side surface). More specifically, the fifth conductive portion 173b may be attached to the inner surface of the cover 30 by the eighth adhesive layer 175.

In an example embodiment, the third conductive label 100e may further include a third insulating layer 177 and a fourth insulating layer 179. The third insulating layer 177 may be attached to one surface of the third conductive layer 173 by a ninth adhesive layer 181, the one surface facing the first system substrate 10a. The third insulating layer 177 may suppress short-circuit defects due to contact between the third conductive layer 173 and the first system substrate 10a.

In addition, the fourth insulating layer 179 may be attached to one surface of the third conductive layer 173 by a tenth adhesive layer 183, the one surface facing the second system substrate 10b. The fourth insulating layer 179 may suppress short-circuit defects due to contact between the third conductive layer 173 and the second system substrate 10b.

Figure 14:
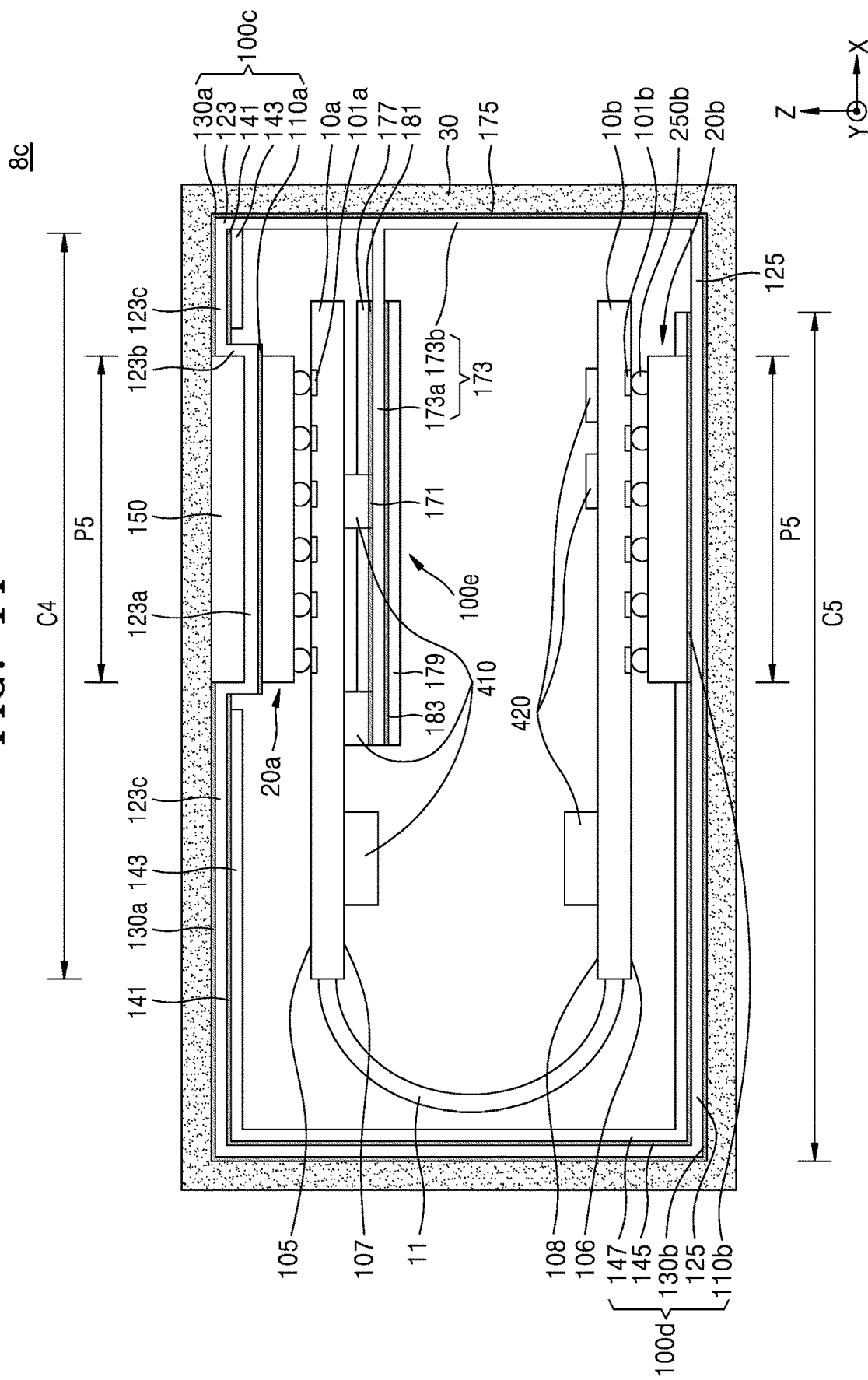
FIG. 14 is a cross-sectional view of a semiconductor apparatus according to an example embodiment of the inventive concept.

FIG. 14 is a cross-sectional view of a semiconductor apparatus 8c according to an example embodiment of the inventive concept. Hereinafter, repeated descriptions between the semiconductor apparatus 8b of FIG. 13 and the semiconductor apparatus 8c of FIG. 14 will be omitted, and differences therebetween will be mainly described.

Referring to FIG. 14, the first conductive label 100c and the second conductive label 100d may be connected to each other and attached to the inner surface of the cover 30. In other words, the first conductive label 100c and the second conductive label 100d may be attached to the inner surface of the cover 30 while integrated.

In an example embodiment, the second adhesive layer 130a, the first conductive layer 123, the fifth adhesive layer 141, and the first insulating layer 143 of the first conductive label 100c may be respectively connected to the fourth adhesive layer 130b, the second conductive layer 125, the sixth adhesive layer 145, and the second insulating layer 147 of the second conductive label 100d and thus integrated.

In an example embodiment, the first conductive label 100c and the second conductive label 100d may respectively include the first insulating layer 143 and the second insulating layer 147 to prevent electrical short circuits occurring due to contact between each of the first conductive layer 123 and the second conductive layer 125 and each of the first system substrate 10a, the second system substrate 10b, and the flexible substrate 11.

However, the inventive concept is not limited thereto, and the fifth adhesive layer 141, the first insulating layer 143, the sixth adhesive layer 145, and the second insulating layer 147 may be omitted from the first conductive label 100c and the second conductive label 100d.

In an example embodiment, the third conductive layer 173 of the third conductive label 100e may be connected to the first conductive layer 123 of the first conductive label 100c and attached to the inner surface of the cover 30.

More specifically, the eighth adhesive layer 175 and the third conductive layer 173 of the third conductive label 100e may be respectively connected to the second adhesive layer 130a and the first conductive layer 123 of the first conductive label 100c and thus integrated.

In addition, the third conductive layer 173 of the third conductive label 100e may be connected to the second conductive layer 125 of the second conductive label 100d and attached to the inner surface of the cover 30.

More specifically, the eighth adhesive layer 175 and the third conductive layer 173 of the third conductive label 100e may be respectively connected to the fourth adhesive layer 130b and the second conductive layer 125 of the second conductive label 100d and thus integrated.

In an example embodiment, the third conductive label 100e may be connected to at least one of the first conductive label 100c and the second conductive label 100d. As shown in FIG. 14, the third conductive label 100e may be connected to both the first conductive label 100c and the second conductive label 100d. However, the inventive concept is not limited thereto, and the third conductive label 100e may be connected to only one of the first conductive label 100c and the second conductive label 100d.

In an example embodiment, the first conductive label 100c, the second conductive label 100d, and the third conductive label 100e may be connected to each other and attached to the entire inner surface of the cover 30. For example, the inner surface of the cover 30 may not be exposed by the first conductive label 100c, the second conductive label 100d, and the third conductive label 100e. Though the length in the Y direction of the first conductive label 100c, the second conductive label 100d, and the third conductive label 100e are not shown, in one embodiment, these lengths may extend from one side surface of the semiconductor apparatus 8c to the opposite side surface in the Y direction. However, in other embodiments, the lengths in the Y direction of these components may be, for example, the same length as a length in the Y direction of one or both of the semiconductor packages 20a or 20b, or greater. This same length, or length options, may apply to the other embodiments described herein.

By the above-described structure of the semiconductor apparatus 8c of the inventive concept, the heat generated due to the operation of at least one of the first semiconductor package 20a, the second semiconductor package 20b, and the first electronic module 410 may be transferred to the inner surface of the cover 30. Therefore, the heat dissipation performance of the semiconductor apparatus 8c of the inventive concept may be improved.

Figure 15:
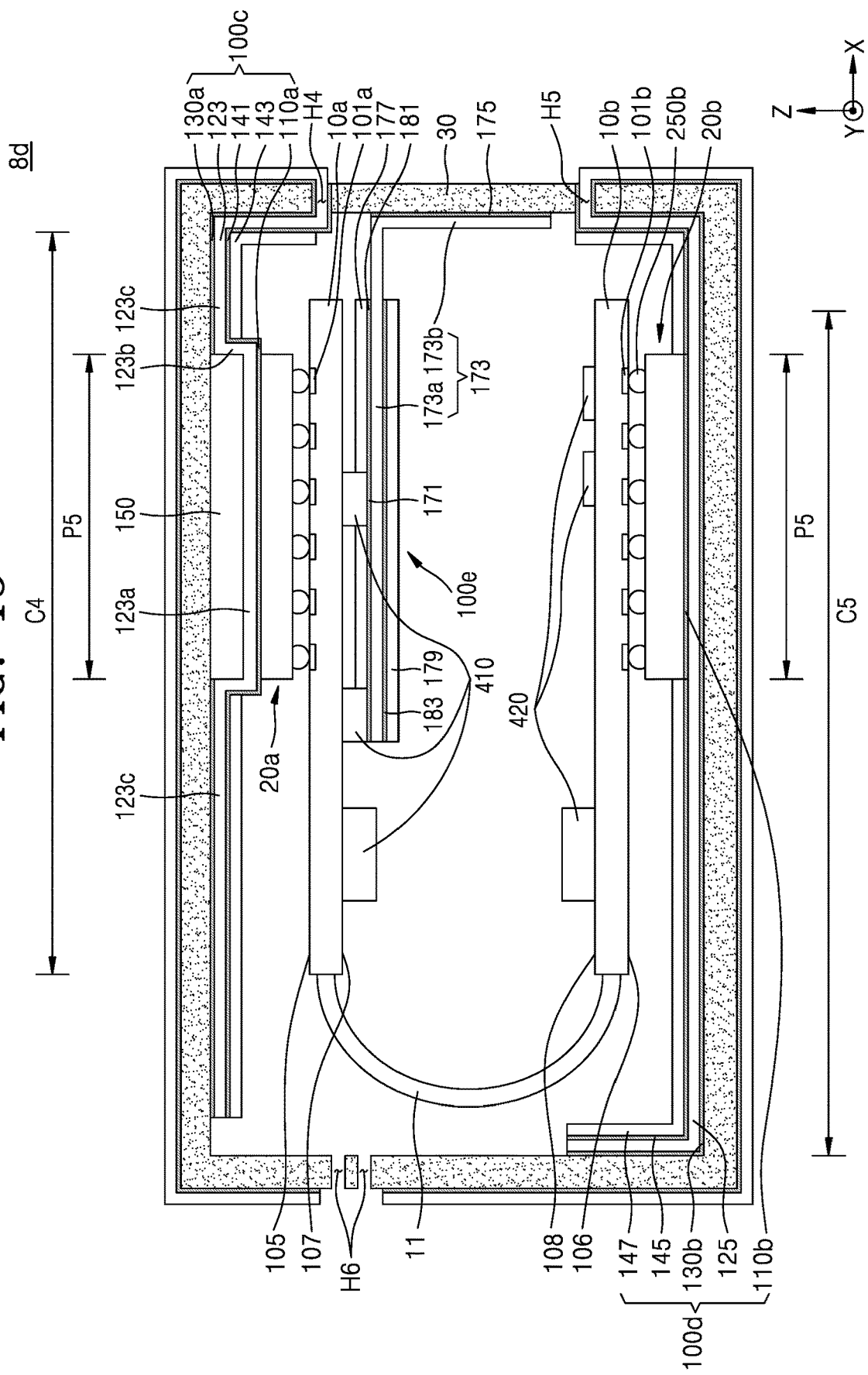
FIG. 15 is a cross-sectional view of a semiconductor apparatus according to an example embodiment of the inventive concept.

FIG. 15 is a cross-sectional view of a semiconductor apparatus 8d according to an example embodiment of the inventive concept. Hereinafter, repeated descriptions between the semiconductor apparatus 8b of FIG. 13 and the semiconductor apparatus 8d of FIG. 15 will be omitted, and differences therebetween will be mainly described.

Referring to FIG. 15, a first heat transfer hole H4, through which the first conductive label 100c may pass, may be formed in the cover 30. In addition, a second heat transfer hole H5, through which the second conductive label 100d may pass, may be formed in the cover 30.

In an example embodiment, the second adhesive layer 130a of the first conductive label 100c may contact the inner surface of the cover 30, as described above. In addition, the second adhesive layer 130a may pass through the first heat transfer hole H4 and thus contact the outer surface of the cover 30.

In addition, the first conductive layer 123 may pass through the first heat transfer hole H4 of the cover 30 by the second adhesive layer 130a and extend to be attached to the outer surface of the cover 30 by the second adhesive layer 130a, as described above. The hole H4 may have equal length sides (e.g., it may be circular, square, etc.) or may be elongated in shape.

In an example embodiment, the fourth adhesive layer 130b of the second conductive label 100d may contact the inner surface of the cover 30, as described above. In addition, the fourth adhesive layer 130b may pass through the second heat transfer hole H5 and thus contact the outer surface of the cover 30.

Further, the second conductive layer 125 may pass through the second heat transfer hole H5 of the cover 30 by the fourth adhesive layer 130b and thus be attached to the outer surface of the cover 30 by the fourth adhesive layer 130b, as described above.

In an example embodiment, the first conductive label 100c and the second conductive label 100d may partially cover the outer surface of the cover 30 and partially expose the outer surface of the cover 30. However, the inventive concept is not limited thereto, and the first conductive label 100c and the second conductive label 100d may cover the entire outer surface of the cover 30.

In an example embodiment, a vent hole H6 may be formed in a portion of the cover 30, to which the first conductive label 100c and the second conductive label 100d are not attached. Air flowing into the semiconductor apparatus 8d through the vent hole H6 may circulate around the first semiconductor package 20a and the second semiconductor package 20b and then be discharged to the outside of the semiconductor apparatus 8d through the vent hole H6. The heat generated from the first semiconductor package 20a and the second semiconductor package 20b may be quickly discharged out of the semiconductor apparatus 8d due to thermal convection by air. Therefore, the heat dissipation performance of the semiconductor apparatus 8d may be improved.

Figure 16:
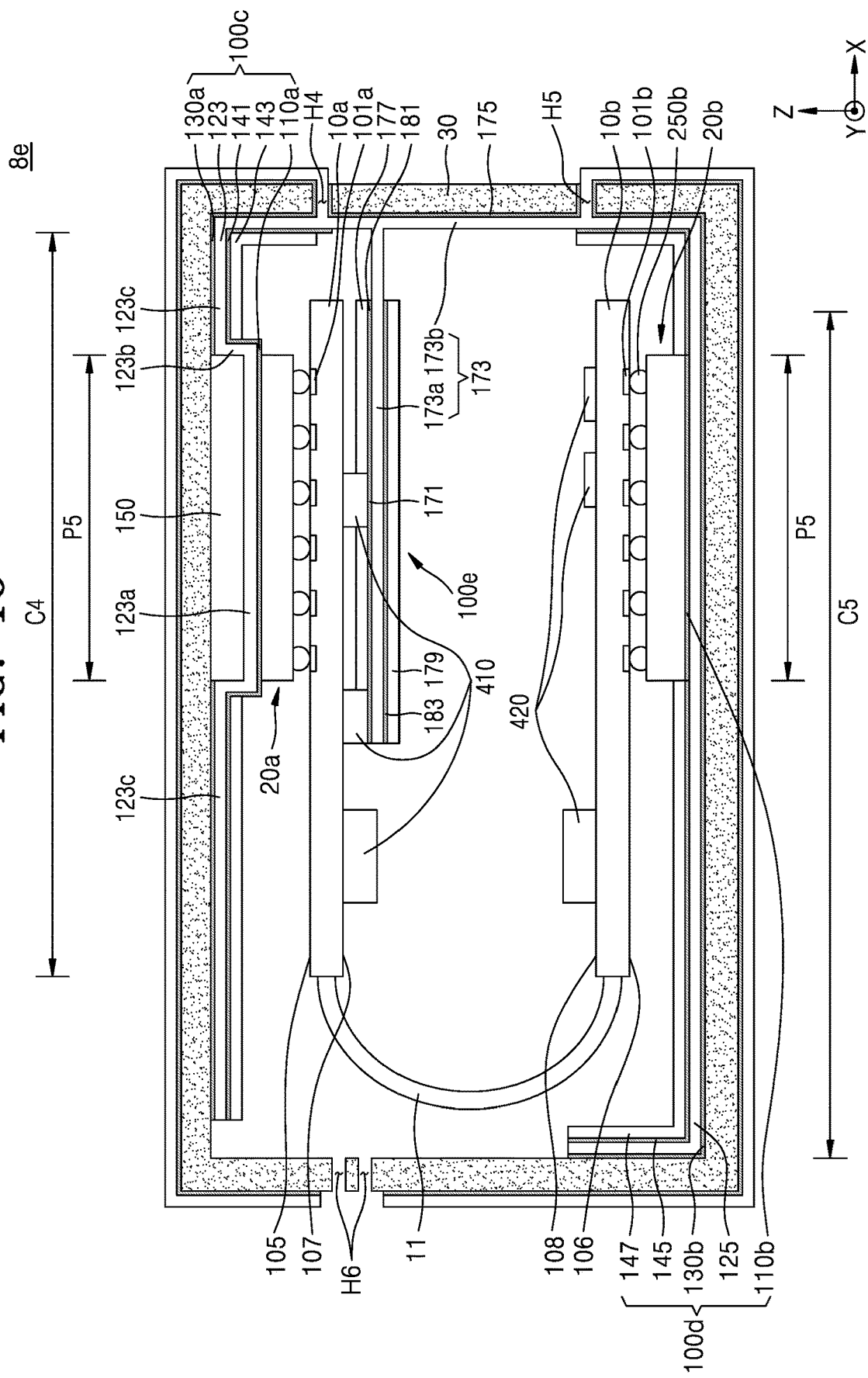
FIG. 16 is a cross-sectional view of a semiconductor apparatus according to an example embodiment of the inventive concept.

FIG. 16 is a cross-sectional view of a semiconductor apparatus 8e according to an example embodiment of the inventive concept. Hereinafter, repeated descriptions between the semiconductor apparatus 8d of FIG. 15 and the semiconductor apparatus 8e of FIG. 16 will be omitted, and differences therebetween will be mainly described.

Referring to FIG. 16, the first conductive label 100c, the second conductive label 100d, and the third conductive label 100e may be connected to each other and attached to the inner surface of the cover 30. For example, the first conductive label 100c, the second conductive label 100d, and the third conductive label 100e may be attached to the inner surface of the cover 30 while integrated. For example, the inner surface of the cover 30 may not be exposed by the first conductive label 100c, the second conductive label 100d, and the third conductive label 100e.

In addition, the first conductive label 100c, the second conductive label 100d, and the third conductive label 100e may be connected to each other and attached to the outer surface of the cover 30. For example, the first conductive label 100c, the second conductive label 100d, and the third conductive label 100e may be attached to the outer surface of the cover 30 while integrated. For example, the outer surface of the cover 30 may not be exposed by the first conductive label 100c, the second conductive label 100d, and the third conductive label 100e.

By the above-described structure of the semiconductor apparatus 8e of the inventive concept, the heat generated due to the operation of at least one of the first semiconductor package 20a, the second semiconductor package 20b, and the first electronic module 410 may be transferred to both the inner surface and the outer surface of the cover 30. Therefore, the heat dissipation performance of the semiconductor apparatus 8e may be improved.

While the inventive concept has been particularly shown and described with reference to embodiments thereof, it will be understood that various changes in form and details may be made therein without departing from the spirit and scope of the following claims.

What is claimed is:

1. A semiconductor apparatus comprising:
   a system substrate;
   a semiconductor package mounted on the system substrate and having a first length in a first horizontal direction;
   a conductive label that is flexible and arranged on the semiconductor package, the conductive label comprising: a first adhesive layer contacting the semiconductor package; a thermally-conductive layer, which is attached to the semiconductor package by the first adhesive layer and has a second length in the first horizontal direction greater than the first length of the semiconductor package; and a second adhesive layer contacting, from among a surface of the thermally-conductive layer, only a portion of the surface of the thermally-conductive layer wherein the portion is less than an entirety of the surface of the thermally-conductive layer, the portion not vertically overlapping the semiconductor package;
   a thermal interface material arranged on the thermally-conductive layer to vertically overlap the semiconductor package; and
   a cover comprising: a first cover portion vertically overlapping the semiconductor package and contacting the thermal interface material; and a second cover portion to which the thermally-conductive layer is attached by the second adhesive layer.

2. The semiconductor apparatus of claim 1, wherein the thermally-conductive layer comprises:
   a first thermally-conductive portion extending horizontally, and which vertically overlaps the semiconductor package and is arranged between the first adhesive layer and the thermal interface material;
   a second thermally-conductive portion, which is bent upward from the first thermally-conductive portion and surrounds a side surface of the thermal interface material; and
   a third thermally-conductive portion, which does not vertically overlap the semiconductor package, is bent from the second thermally-conductive portion to extend horizontally, and is attached to the second cover portion by the second adhesive layer.

3. The semiconductor apparatus of claim 2, wherein the thermal interface material is arranged between the first thermally-conductive portion and the first cover portion.

4. The semiconductor apparatus of claim 2, wherein the conductive label further comprises:
   a third adhesive layer contacting a bottom surface of the third thermally-conductive portion; and
   an insulating layer attached to the third thermally-conductive portion by the third adhesive layer to face the system substrate.

5. The semiconductor apparatus of claim 2, wherein the first thermally-conductive portion comprises mesh-type first holes filled with the thermal interface material.

6. The semiconductor apparatus of claim 5, wherein the first adhesive layer comprises second holes vertically overlapping the first holes, and the thermal interface material is arranged in the second holes and contacts a top surface of the semiconductor package.

7. The semiconductor apparatus of claim 1, further comprising:

a second system substrate;

a second semiconductor package mounted on the second system substrate and having a second length in the first horizontal direction; and a second conductive label between the second semiconductor package and the cover, the second conductive label comprising: a third adhesive layer contacting the second semiconductor package; a second thermally-conductive layer arranged on the third adhesive layer and having a third length in the first horizontal direction greater than the second length of the second semiconductor package in the first horizontal direction; and a fourth adhesive layer arranged on the second thermally-conductive layer to contact the cover and attaching the second thermally-conductive layer to an inner surface of the cover.

8. A semiconductor apparatus comprising:

a first system substrate;

a second system substrate vertically apart from the first system substrate;

a flexible substrate connecting the first system substrate to the second system substrate;

a cover surrounding the first system substrate, the second system substrate, and the flexible substrate;

a first semiconductor package mounted on the first system substrate and having a first length in a first horizontal direction;

a second semiconductor package mounted on the second system substrate and having a second length in the first horizontal direction;

a first conductive label between the first semiconductor package and the cover, the first conductive label comprising: a first adhesive layer contacting the first semiconductor package; a first thermally-conductive layer arranged on the first adhesive layer and having a third length in the first horizontal direction greater than the first length of the first semiconductor package in the first horizontal direction; and a second adhesive layer arranged on the first thermally-conductive layer to contact the cover and attaching the first thermally-conductive layer to an inner surface of the cover; and a second conductive label between the second semiconductor package and the cover, the second conductive label comprising: a third adhesive layer contacting the second semiconductor package; a second thermally-conductive layer arranged on the third adhesive layer and having a fourth length in the first horizontal direction greater than the second length of the second semiconductor package in the first horizontal direction; and a fourth adhesive layer arranged on the second thermally-conductive layer to contact the cover and attaching the second thermally-conductive layer to the inner surface of the cover.

9. The semiconductor apparatus of claim 8, further comprising a thermal interface material between the first thermally-conductive layer and the inner surface of the cover.

10. The semiconductor apparatus of claim 9, wherein the first thermally-conductive layer comprises:

a first thermally-conductive portion, which vertically overlaps the first semiconductor package and is arranged between the first adhesive layer and the thermal interface material;

a second thermally-conductive portion, which is bent upward from the first thermally-conductive portion and surrounds a side surface of the thermal interface material; and a third thermally-conductive portion, which is laterally bent from the second thermally-conductive portion and is attached, by the second adhesive layer, to the inner surface of the cover not vertically overlapping the first semiconductor package.

11. The semiconductor apparatus of claim 8, further comprising:

a first electronic module mounted on the first system substrate; and a third conductive label connecting the first electronic module to the cover, the third conductive label comprising: a fifth adhesive layer contacting a top surface of the first electronic module and a third thermally-conductive layer arranged on the fifth adhesive layer and attached, by the fifth adhesive layer, to the top surface of the first electronic module and the inner surface of the cover.

12. The semiconductor apparatus of claim 11, wherein the first system substrate comprises:

a first mounting surface facing the inner surface of the cover; and a second mounting surface opposite to the first mounting surface, and wherein the first semiconductor package is mounted on the first mounting surface, and the first electronic module is mounted on the second mounting surface.

13. The semiconductor apparatus of claim 8, wherein the cover comprises a heat transfer hole, and at least one of the first conductive label and the second conductive label extends to an outer surface of the cover through the heat transfer hole of the cover.

14. The semiconductor apparatus of claim 13, wherein a vent hole, which penetrates the cover, is arranged in a portion of the cover, to which the first conductive label and the second conductive label are not attached.

* * * * *